(12) United States Patent
Dekker

(10) Patent No.: US 10,607,948 B2
(45) Date of Patent: Mar. 31, 2020

(54) SECURED CHIP

(71) Applicant: IRDETO B.V., Hoofddorp (NL)

(72) Inventor: Gerard Johan Dekker, Hoofddorp (NL)

(73) Assignee: IRDETO B.V., Hoofddorp (NL)

( * ) Notice: Subject to any disclaimer, the term of this patent is extended or adjusted under 35 U.S.C. 154(b) by 0 days.

(21) Appl. No.: 16/304,343

(22) PCT Filed: Jun. 2, 2017

(86) PCT No.: PCT/EP2017/063575
§ 371 (c)(1),
(2) Date: Nov. 26, 2018

(87) PCT Pub. No.: WO2017/207806
PCT Pub. Date: Dec. 7, 2017

(65) Prior Publication Data
US 2019/0295963 A1    Sep. 26, 2019

(30) Foreign Application Priority Data

Jun. 3, 2016 (GB) .................................. 1609781.8

(51) Int. Cl.
*H01L 23/00* (2006.01)
*G06K 19/077* (2006.01)
(Continued)

(52) U.S. Cl.
CPC .......... *H01L 23/576* (2013.01); *G06K 19/077* (2013.01); *H01J 37/3174* (2013.01);
(Continued)

(58) Field of Classification Search
None
See application file for complete search history.

(56) References Cited

U.S. PATENT DOCUMENTS

| 4,766,516 A | 8/1988 | Ozdemir et al. |
| 6,303,474 B1 | 10/2001 | Steffen |

(Continued)

FOREIGN PATENT DOCUMENTS

| WO | 00/49538 A1 | 3/2011 |
| WO | 2012/150398 A1 | 11/2012 |

(Continued)

OTHER PUBLICATIONS

Yamamoto, Dai, et al. "A Technique Using PUFs for Protecting Circuit Layout Designs against Reverse Engineering." Advances in Information and Computer Security Lecture Notes in Computer Science, 2014, pp. 158-173., doi:10.1007/978-3-319-09843-2_13. (Year: 2014).*

(Continued)

*Primary Examiner* — J. E. Schoenholtz
(74) *Attorney, Agent, or Firm* — Rimon PC; Marc Kaufman

(57) ABSTRACT

A method of individualizing a semiconductor chip of a batch of semiconductor chips with respective individualization data of the semiconductor chip, the method comprising, applying a plurality of circuit layouts to the semiconductor chip to form a plurality of circuits on the semiconductor chip, wherein for each circuit layout, said circuit layout is arranged such that, (a) the corresponding circuit, when triggered, falls into any one of two or more respective triggered states, and (b) one of the two or more respective triggered states is a respective preferred state defined by said circuit layout, wherein the plurality of respective preferred states of the circuits in the plurality of circuits encode the individualization data, and wherein each individualized semiconductor chip of the batch of semiconductor chips comprises a generic circuit.

16 Claims, 10 Drawing Sheets

(51) Int. Cl.
    *H01J 37/317*     (2006.01)
    *H01L 23/544*     (2006.01)
    *H01L 25/065*     (2006.01)

(52) U.S. Cl.
    CPC ........ *H01L 23/544* (2013.01); *H01L 25/0657* (2013.01); *H01L 2223/5444* (2013.01)

(56) References Cited

U.S. PATENT DOCUMENTS

| | | | |
|---|---|---|---|
| 8,525,169 B1* | 9/2013 | Edelstein | H01L 23/544 257/48 |
| 2002/0074666 A1 | 6/2002 | Usami et al. | |
| 2006/0064191 A1 | 3/2006 | Naya et al. | |
| 2007/0183194 A1 | 8/2007 | Devadas et al. | |
| 2008/0119956 A1 | 5/2008 | Mangel | |
| 2011/0062240 A1 | 3/2011 | Anderson et al. | |

FOREIGN PATENT DOCUMENTS

| | | |
|---|---|---|
| WO | 2014/056515 A1 | 4/2014 |
| WO | 2017/207806 A1 | 12/2017 |

OTHER PUBLICATIONS

International Search Report and Written Opinion received for International Application No. PCT/EP2017/063575 dated Nov. 14, 2017, 16 pages.

Yamamoto et al., "A Technique Using PUFs for Protecting Circuit Layout Designs against Reverse Engineering", vol. 8639, Aug. 27, 2014, pp. 158-173.

Kumar et al., "Design of Unique and Reliable Physically Unclonable Functions Based on Current Starved Inverter Chain", 2011, IEEE Computer Society Annual Symposium on VLSI, pp. 224-229.

"Photolithography—Wikipedia", URL: https://en.wikipedia.org/wiki/Photolithography, 11 pages.

Holcomb et al., "Power-Up SRAM State as an Identifying Fingerprint and Source of True Random Numbers" IEEE Transactions on Computers, vol. 58, No. 9, Sep. 2009, pp. 1198-1210.

"Electron-beam lithography—Wikipedia", URL: https://en.wikipedia.org/wiki/Electron-beam_lithography, 7 pages.

"Integrated circuit layout—Wikipedia", URL: https://en.wikipedia.org/wiki/Integrated_circuit_layout, 2 pages.

Torrance et al. "The state-of-the-art in semiconductor reverse engineering" 2011 48th ACM/EDAC/IEEE Design Automation Conference (DAC), pp. 333-338.

Masalskis et al., "Reverse Engineering of CMOS Integrated Circuits", vol. 8, No. 88, 2008, pp. 25-28.

"Three-dimensional integrated circuit—Wikipedia", https://en.wikipedia.org/wiki/Three-dimensional_integrated_circuit, 10 pages.

"Very Large Scale Integration—Wikipedia", URL: https://en.wikipedia.org/wiki/Very_Large_Scale_Integration, 3 pages.

Combined Search and Examination Report Opinion received for UK Application No. GB1609781.8 dated Dec. 1, 2016, 7 pages.

Yamamoto D. et al., "A Technique Using PUFs for Protecting Circuit Layout Designs against Reverse Engineering." Advances in Information and Computer Security, Aug. 29, 2014, vol. 8639, pp. 158-173.

Intellectual Property Office of Singapore, Search Report and Written Opinion for Singapore Applicatio No. 11201810613U dated Sep. 26, 2019.

* cited by examiner

1

SECURED CHIP

FIELD OF THE INVENTION

The present invention relates to individualized semiconductor chips and the manufacture of individualized semiconductor chips. More particularly, the invention relates to individualized semiconductor chips that are resistant to reverse engineering.

BACKGROUND OF THE INVENTION

Electronic devices and systems which use integrated circuits are many-fold and ubiquitous. From the early days of semiconductor chips having hundreds of transistors, today's Very Large Scale Integration (VLSI) type semiconductor chips may have billions of transistors, allowing for complex functionality to be provided on a single semiconductor chip.

The functionality provided by the semiconductor chip may often require that the semiconductor chip is in some way unique and identifiable. For example, such functionality may be required for chips involved in authentication procedures such as for payment cards or smart cards for the delivery of media content or more generally the "secure enclaves" provided in modern mobile devices that handle device specific authentication and/or data encryption and the like. Often the unique data are, or the data processing is, required to be secret or confidential (for example, where a particular cryptographic key is embedded within the semiconductor chip itself).

However, while there is a need for individualization, for reasons of cost an efficiency semiconductor chips are typically manufactured in bulk, with modern manufacturing process that strongly favour the production large numbers of identical chips. The most widely used methods of bulk manufacturing semiconductor devices (or chips), such as VLSI semiconductor devices, uses stepper machines and optical (UV) lithography. As semiconductor chips and their manufacture is well-known, further detail shall not be provided herein. However, more information on semiconductor chips and the manufacture thereof (in particular VLSI type chips) can be found at, for example, https://en.wikipedia.org/wiki/Very-large-scale_integration, the entire contents of which are incorporated herein by reference. This allows large numbers of identical semiconductor chips to be created from single wafers of substrate (such as silicon). As is well-known, lithographic techniques typically involve selectively removing areas of a resist, which initially covers a surface of the substrate. This enables creation of very small structures in the resist that can subsequently be transferred to the substrate material by further processing. Such further processing typically involves etching and/or deposition of further material. The resultant structures on the substrate implement electronic circuits that provide the functionality of the semiconductor chip.

The optical (UV) lithography that is typically used in bulk manufacture of such chips involves using a photosensitive "resist", and a mask having a negative (or positive depending upon the resist mechanism) image of the circuits to be applied. Light (typically UV light) is shone through the mask onto the resist. The areas of the resist illuminated by the light are chemically altered such that they may be selectively removed using a further chemical process. Typically, the optical exposure changes the solubility of the resist, enabling selective removal of either the exposed or non-exposed regions of the resist by immersing the resist in a solvent (i.e. developing). This creates the very small structures in the resist. As optical lithography (or photolithography) is well-known, further detail shall not be provided herein. However, more information on optical lithography can be found at, for example, https://en.wikipedia.org/wiki/Photolithography the entire contents of which are incorporated herein by reference.

The masks used in this lithographic technique are costly to make and it is considered impractical to make individual masks for the purpose of embedding unique identification data in individual chips. Therefore, such unique identification data may be embedded into bulk manufactured chips using programmable ROM (such as PROM). This typically, involves selectively applying a high voltage across certain transistors of the chip, after initial manufacture, to "blow" (or otherwise cause the transistor to break down) thereby encoding one bit of data for each transistor. However, such a technique is vulnerable to hardware attacks involving an attacker using probes, electromagnetic radiation, chemical reactions etc. to try to determine the inner workings or embedded information of the hardware device, or enable further functionality present on the chip but not authorized for use. Indeed, an attacker may simply use various scanning devices on a given chip to map the circuits on the chip, and simply create a clone chip, which would have the same embedded data.

However, optical lithography is known to introduce variability in the manufactured chips due to variations in lithographic distortion. Also lithographic techniques in general are subject to manufacturing tolerances that produce variations in the manufactured chips due to thickness variations resulting from chemical mechanical polishing (CMP), unevenness in film deposition and so on.

It is known that these variations can result in bulk manufactured chips having individual "fingerprints". An example of this is the Physical Unclonable Functions (PUF) described in "Power-Up SRAM State as an Identifying Fingerprint an Source of True Random Numbers", D. E. Holcomb et al., IEEE Transactions on Computers, 58, (2009), pp 1198-1210, which is incorporated herein by reference in its entirety. These manufacturing variations leads to memory cells being biased towards "1" or "0" on power up in dependence on the variations. Therefore, after chip manufacture it is possible to test the chip in order to determine memory cells with a bias. The biases of these cells represent a unique identification (or "fingerprint") for the chip. The identity can be reliably detected with the use of an error correcting code. The very high number of memory cells on a chip leads to essentially unique fingerprints. In essence, the fingerprint value may be used to both represent an identification and/or a secret key which is sometimes used to authenticate the identity.

Even if an attacker were to clone one of these chips, the uncontrollable manufacturing variations ensure that the cloned chip would have a different set of variations and therefore a different fingerprint. Of course, as a corollary, since the fingerprint of a chip is dependent on the uncontrollable manufacturing variations, the manufacturer cannot embed a pre-determined fingerprint onto a given chip.

Semiconductor chips can also be created using electron-beam lithography (or e-beam lithography). E-beam lithography involves scanning a focused beam of electrons to draw or write custom shapes on an electron-sensitive resist. As fine control of beam scanning is possible, there is no need to use a mask. Here, the electron beam changes the solubility of the resist, enabling selective removal of either the exposed or non-exposed regions of the resist by immersing the resist in a solvent. As e-beam lithography is well-known, further detail shall not be provided herein. However, more information on e-beam lithography can be found at, for example, http://en.wikipedia.org/wiki/Electron-beam_lithography, the entire contents of which are incorporated herein by reference. An example of creation of chips using electron beam lithography is by Mapper Lithography (see http://www.mapperlithography.com/). Unfortunately, whilst e-beam lithography can be used for producing short runs of semiconductor chips it tends to be unsuitable (due to cost and speed) for the bulk manufacture of semiconductor chips, especially VSLI type chips. In some system, such as those produced by Mapper Lithography, many individually controlled e-beams are used in parallel in an attempt to overcome this problem.

SUMMARY OF THE INVENTION

It is not possible to embed arbitrary data into known PUF devices, and explicitly individualized chips (such as those using OTP ROM) are vulnerable to hardware-type reverse engineering. In particular, explicitly individualized chips produced using E-Fuse technology may be very vulnerable to hardware-type reverse engineering. It would, therefore be desirable to provide additional ways of securing semiconductor chips against such reverse engineering, that also permit individualization, such as the embedding of arbitrary data that cannot easily be cloned by an attacker.

According to a first aspect of the invention there is provided a method of individualizing a semiconductor chip of a batch of semiconductor chips with respective individualization data of the semiconductor chip. The method comprises applying a plurality of circuit layouts to the semiconductor chip to form a plurality of circuits on the semiconductor chip. For each circuit layout said circuit layout is arranged such that: (a) the corresponding circuit, when triggered, falls into any one of two or more respective triggered states, and (b) one of the two or more respective triggered states is a respective preferred state defined by said circuit layout. The plurality of respective preferred states of the circuits in the plurality of circuits encode the individualization data, and each individualized semiconductor chip of the batch of semiconductor chips comprises a generic circuit.

In some embodiments the plurality of respective preferred states of the circuits in the plurality of circuits encode the individualization data using an error correcting code.

In some embodiments for one or more circuit layouts, each circuit layout comprises two or more respective variant sub-circuit layouts. Each respective sub-circuit layout corresponds to a respective triggered state of the circuit corresponding to the circuit layout. Preferably one of the respective variant sub-circuit layouts comprises a circuit layout variation with respect to the other ones respective variant sub-circuit layouts. The circuit layout variation may comprise any of, a dimension of a functional element, a position shift of a functional element, and a characteristic of a functional element. The functional element may comprise any of: a gate; a source; a drain; a well; a resistor; a capacitor; a connection; and so on.

In some embodiments the generic circuit was (or is) formed on the semiconductor chip using a coarser resolution. The circuit layout variation defines a difference of the variant sub-circuit formed by applying the one of the respective variant sub-circuit with respect to the variant sub-circuits formed by applying the other ones respective variant sub-circuit layouts that cannot be resolved (or fully characterized) at the coarser resolution.

In some embodiments the generic circuit was formed on the semiconductor chip using a coarser resolution, and at least one circuit layout of the plurality of the circuit layouts comprises a set of functional elements that cannot be resolved at the coarser resolution. Preferably, the at least one circuit layout is applied using a beam steered lithographic process with a finer resolution, and/or the generic circuit is formed on the semiconductor chip using a mask based lithographic process In some embodiments the individualization data comprises one or more cryptographic keys and/or one or more enablement vectors specifying the functionality of the generic circuit available to the individualized semiconductor chip.

In some embodiments one or more of the circuit layouts may comprise a respective obfuscated circuit layout.

According to a second aspect of the invention there is provided a batch of individualized semiconductor chips (such as those processed by one of the methods of the invention described above). Each individualized semiconductor chip comprises a generic circuit; and a respective individualized plurality of circuits. For each circuit of the respective plurality, said circuit corresponds to a respective circuit layout which is arranged such that: (a) the corresponding circuit, when triggered, falls into any one of two or more respective triggered states, and (b) one of the two or more respective triggered states is a respective preferred state defined by said circuit layout. The respective individualized plurality of respective preferred states are arranged to encode respective individualization data.

According to a third aspect of the invention there is provided a method of securely embedding a circuit on a semiconductor wafer to form a reverse engineering resistant semiconductor chip. The method comprises applying, a first circuit layout to the semiconductor wafer using first lithographic process, wherein the first lithographic process has a first characteristic resolution and applying, a second circuit layout to the semiconductor wafer using a second lithographic process to form the securely embedded circuit, wherein the second lithographic process has a second characteristic resolution. The second circuit layout is arranged to define a set of functional elements in the second circuit that cannot be resolved (or fully characterized) at the first characteristic resolution.

According to a fourth aspect of the invention there is provided a method of securely embedding a circuit on a semiconductor wafer to form a reverse engineering resistant semiconductor chip. The method uses a first lithographic process having a first characteristic resolution corresponding to a set of coarser resolutions, and a second lithographic process having a second characteristic resolution corresponding to a set of finer resolutions. The method comprises, (a) for one or more layers of the semiconductor chip: applying a respective circuit layout from a first set of circuit layouts to said layer using a first lithographic process at a respective coarser resolution from the set of coarser resolutions, to form a respective circuit at said respective coarser resolution. Also, (b) for one layer of the semiconductor chip a circuit layout is applied to said layer using a second lithographic process at a respective finer resolution from the set of finer resolutions, to form the securely embedded circuit at said respective finer resolution. The circuit layout is arranged to define a set of functional elements in said securely embedded circuit that cannot be resolved (or fully characterized) at the respective coarser resolution of the set of coarser resolutions.

In some embodiments, the circuit layout is arranged to define a set of functional elements in said securely embedded circuit that cannot be resolved at any of the coarser resolutions of the set of coarser resolutions.

In some embodiments, the one layer of step (b) is one of the one or more layers of step (a), such that the one layer of step (b) comprises both the respective circuit at said respective coarser resolution and the securely embedded circuit at said respective finer resolution. Preferably the one layer of the semiconductor chip comprises the base layer, and/or the securely embedded circuit uses one or more connections of a circuit in a higher layer.

In some embodiments, the first lithographic process comprises a mask based lithographic process, and/or the second lithographic process comprises a beam steered lithographic process.

According to a fourth aspect of the invention there is provided a method (such as the method of the first aspect and any of its related embodiments) of individualizing a semiconductor chip of a batch of reverse engineering resistant semiconductor chips with individualization data corresponding to the semiconductor chip, wherein the step of applying the plurality of circuit layouts to the semiconductor chip to form the plurality of circuits on the semiconductor chip securely embedding the plurality of circuits on the semiconductor chip using a method according to any of the third or fourth aspects of the invention (or any of their respective embodiments).

According to a fourth aspect of the invention there is provided a reverse engineering resistant semiconductor chip (such as that formed by the methods according to the third, fourth or fifth, aspects of the invention or their related embodiments). The chip comprises a first circuit corresponding to a first circuit layout, the first circuit layout having a first characteristic resolution, and a second circuit corresponding to a second circuit layout, the second circuit layout having a second characteristic resolution. The second circuit layout is arranged to define a set of functional elements in the second circuit that cannot be resolved (or fully characterized) at the first characteristic resolution.

BRIEF DESCRIPTION OF THE DRAWINGS

Embodiments of the invention will now be described, by way of example only, with reference to the accompanying drawings, in which.

DETAILED DESCRIPTION OF EMBODIMENTS OF THE INVENTION

In the description that follows and in the figures, certain embodiments of the invention are described. However, it will be appreciated that the invention is not limited to the embodiments that are described and that some embodiments may not include all of the features that are described below. It will be evident, however, that various modifications and changes may be made herein without departing from the broader spirit and scope of the invention as set forth in the appended claims.

Figure 1:
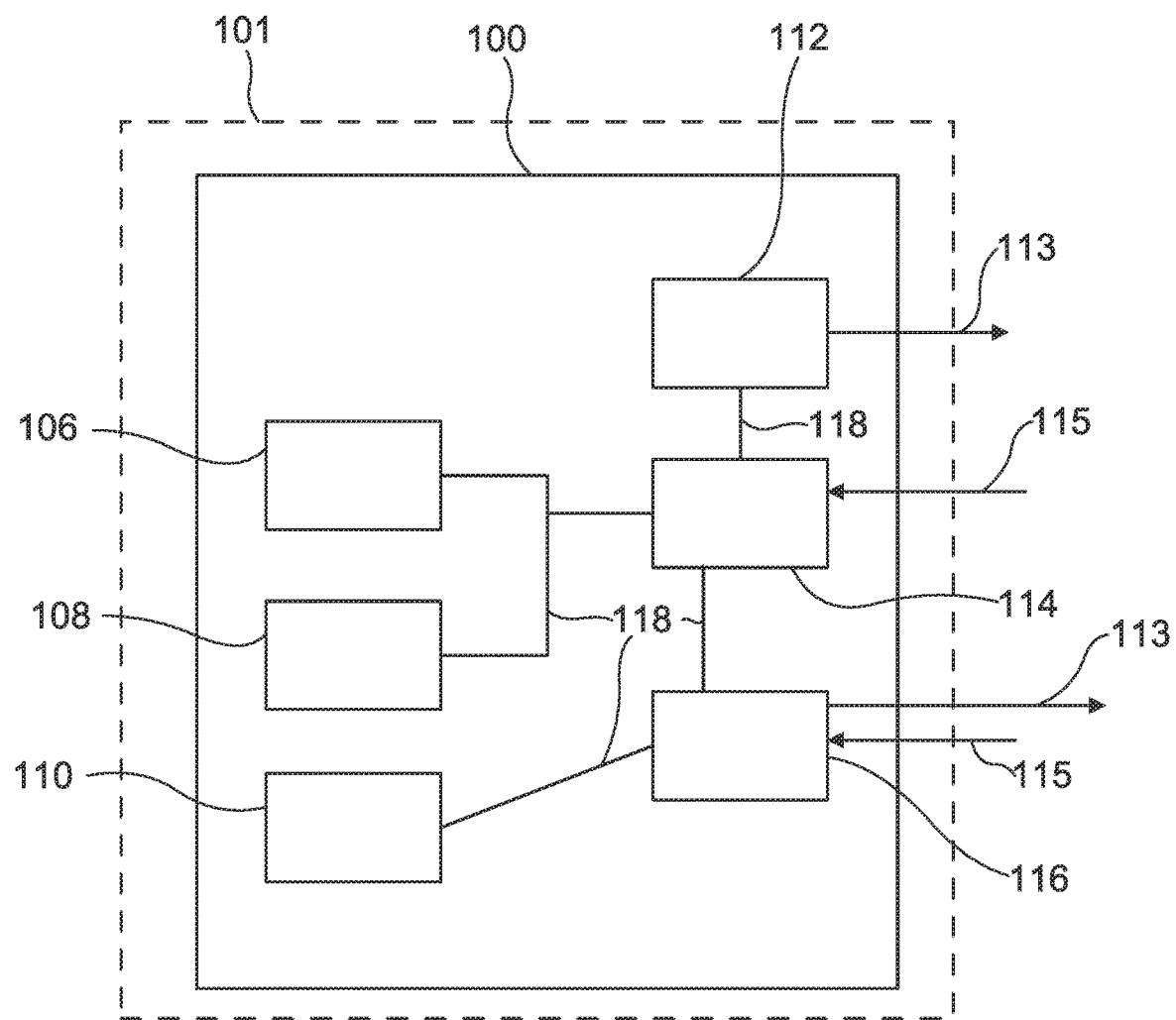
FIG. 1 schematically illustrates an example system of the sort that may be implemented on a silicon chip.

FIG. 1 schematically illustrates an example system 100 of the sort that may be implemented on a silicon chip 101. The system 100 typically comprises one or more logical blocks (or modules) 106; 108; 110; 112; 114; 116. In the example system 100 shown in FIG. 1 the system comprises six logical blocks 106; 108; 110; 112; 114; 116 but it will be appreciated that this is merely exemplary and any number of logical blocks 106; 108; 110; 112; 114; 116 may be present in a particular system 100. The logical blocks 106, . . . , 116 are interconnected by one or more logical connections 118. The topology of the logical connections 118 as shown in FIG. 1 is, again, merely exemplary.

One or more logical blocks 106, . . . , 116, such as the logical block 114, may comprise one or more inputs 115. The one or more inputs 115 may provide data to the system 100 to be processed by the logical blocks 106, . . . , 116.

One or more logical blocks 106, . . . , 116, such as the logical block 112, may comprise one or more outputs 113. The one or more outputs 113 may output data from the system 100, such as results of processing by the logical blocks 106, . . . , 116.

One or more logical blocks 106, . . . , 116, such as the logical block 116 may comprise one or more inputs 113 and one or more outputs 115.

The skilled person will appreciate that the system 100 is arranged to provide desired functionality. The logical blocks 106, . . . , 116 typically comprise any of operations, functions, processing, procedures, data flows, etc. used by the system 101 to implement the desired functionality. Typically, the logical blocks 106, . . . , 116 are analogous to subroutines or functions or modules in a piece of computer software.

The skilled person will appreciate that the desired functionality implemented by a system 100 such as the example system 100 is not limited in terms of complexity. For example, the system 100 may implement a decryption routine, where encrypted data (and optionally a cryptographic key) is input into the system 100 through an input 115, and decrypted data is output from the system 100 through an output 113. In this case each logic block 106, ..., 116 may comprise a different function used in the decryption process (such as the Feistel function or the key schedule function of DES). A logic block 106, ..., 116 may comprise logic that stores or generates a particular cryptographic key. Such a system 100 would typically be used with other systems 100 on other silicon chips 101 as part of a complete device.

In other examples the system 101 may implement a full system on chip type system (such as Turing complete processing system). In this case the logic blocks 106, ..., 116 may comprise more complex functionality, such as any of: a general purpose microprocessor, a memory controller, an Ethernet controller, a graphics processing unit, one or more random access memory units etc. It will be appreciated that a logic block 106, ..., 116 itself may be a system 100 comprising further logic blocks 106, ..., 116, and so on and so forth.

One or more of the logic blocks 106, ..., 116 may implement a security-related operation (potentially in addition to one or more other operations). For example, the security-related operation may use secret data (such as a cryptographic key)—the secret data may be stored by a given logic block(s) 106, ..., 116, or said logic block(s) 106, ..., 116 may be arranged to implement the cryptographic key. The security-related operation may comprise one or more of (i) a cryptographic operation (such as one or more: of an encryption operation; a decryption operation; a digital signature generation operation; a digital signature verification operation; a hash generation operation; a hash verification operation); (ii) a conditional access operation; (iii) a digital rights management operation; (iv) a (cryptographic) key management operation. Such security-related operations are well-known and shall, therefore, not be described in more detail herein. In general, though, the security-related operation is an operation for which (a) it is desirable to prevent an attacker from accessing some or all of the data being used for performing the security-related operation (e.g. the secret data) and/or (b) it is desirable to prevent an attacker from modifying or changing the functioning or processing of the security-related operation to thereby make the security-related operation perform in an unauthorized manner or provide a result that the attacker is not entitled to achieve.

Figure 2A:
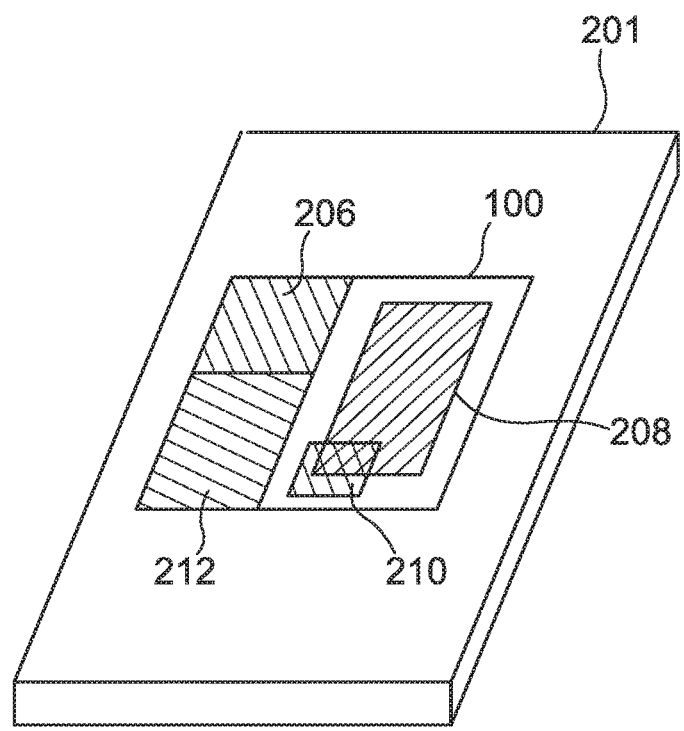
FIG. 2A schematically illustrates a surface view of an example silicon chip having a system, such as the system of FIG. 1, implemented thereon.

FIG. 2A schematically illustrates a surface view of an example silicon chip 201 having a system 100 (such as the system 100 of FIG. 1) implemented thereon. The silicon chip 201 is shown as comprising four circuits 206, 208, 210, 212 but it will be appreciated that this is merely exemplary and any number of circuits may be present. It will be appreciated that the circuits 206, 208, 210, 212 are typically arranged to operate together to implement the system 100, effectively as a single, chip-wide, circuit. However, for ease of discussion herein particular circuits 206, 208, 210, 212 (and their corresponding circuit layouts described shortly) will be discussed separately.

As is usual in the field of semiconductor integrated circuits, each circuit 206, 208, 210, 212 typically corresponds to a respective logic block 106, ..., 116 of the system 100. In particular, each circuit 206, 208, 210, 212 may implement the functionality of the respective logic block 106, ..., 116. The circuits are formed using standard techniques known to those skilled in the art of the manufacture of VLSI production as set out previously. In particular the process involves, for each circuit 206, 208, 210, 212, etching a respective circuit layout on to the silicon chip (i.e. the silicon wafer that forms the silicon chip 201). The etching uses standard lithographic techniques, such as mask based UV lithography (as described above). Various well-known techniques for depositing required metals and/or oxides may also be used in addition to form each circuit 206, 208, 210, 212. Given such chip fabrication is well-known to the skilled person we will not discuss these aspects further herein. This process may be thought of as applying a particular circuit layout to the silicon chip to form a particular circuit.

A circuit layout (sometimes known as a mask layout or mask design) is a well-known concept in the field of integrated circuit manufacture, and typically comprises a flat geometric representation (or image) of a circuit 206, 208, 210, 212 to be etched on the chip. Typically, a circuit layout is represented as a bitmap type image, or a set of such images. In this way it will be appreciated that a circuit layout may be represented by a binary image, or more typically a set of binary images. Each binary image indicating areas (or regions) to be etched away. For example, in the case of a CMOS chip the process of applying a circuit layout typically comprises a number of etching steps. This allows for additional material (such as polysilicon or metal) to be deposited between etchings, enabling the building up of complex structures. As such the skilled person would understand that the circuit layout may be represented by a number of images, each indicting the areas of a particular material (such as the field oxide, polysilicon, metal, and so on) to be etched away. For ease of discussion, with reference to FIGS. 2A, 2B and 3, applying a circuit layout will be discussed as if it were a single step.

In other words, a circuit layout typically defines a plurality of functional (or constructional) features (or elements or constructional elements) that are to make up (or be part of) the corresponding circuit. A functional element may be thought of as (or part of) an electronic component that provides particular functionality. For example a functional element may be any part of: a transistor, a resistor, an interconnect, a diode, a register etc. Typically, a functional element is one of the particular features that make up the structure of a particular component, such as a transistor. In some cases, such as short interconnects (or wires) the component is a single functional element.

It will be appreciated that typically the circuits 206, 208, 210, 212 referred to herein are formed as part of a single, chip-wide, circuit. However, for eased of discussion herein we will refer to applying respective circuit layouts for each circuit 206, 208, 210, 212, to highlight more clearly the properties of the particular circuit 206, 208, 210, 212 and their respective layouts. In some embodiments, therefore, the circuit (and the corresponding circuit layout) referred to herein will be for the full chip-wide circuit for the system 100. However, in other embodiments, the circuit (and the corresponding circuit layout) referred to herein will be for a sub-part or even a specific layer (i.e. not the whole) of the full chip-wide circuit for the system 100.

For example, in the case of a CMOS chip a transistor usually comprises a well, a diffusion area, a polysilicon element (such as a gate), and metal contacts. Any of these may be understood to be a functional element.

As the concept of a circuit layout is well-known, further detail shall not be provided herein. However, more information the concept of a circuit layout can be found at, for example, https://en.wikipedia.org/wiki/Integrated_circuit_layout the entire contents of which are incorporated herein by reference.

It will be appreciated that circuit layouts are typically produced by computer aided design based on the functionality of the logic block to be implemented in the corresponding circuit. Such a process may comprise several design stages, typically starting with a specification of the circuit layout in a high level language (such as VHDL) and given such processes are well-known in the art, we do not discuss these further herein. The operation of circuits may usually be predicted from computer simulations on the corresponding circuit layout. For example, the Simulation Program with Integrated Circuit Emphasis (SPICE) package is often used to predict whether a circuit corresponding to a given circuit layout implements the correct functionality and/or performance.

A silicon chip 201, such as the silicon chip 201 in FIG. 2A, typically has an associated "node" (also known as process step or process dimension). The node, typically given in nanometres, relates to the smallest single functional element that can be applied to the chip. Usually, the node is defined as the average half-pitch of a notional DRAM memory cell fabricated using the same process. The half-pitch is usually defined as half the distance between identical bit cells in such a notional DRAM memory cell.

It will be appreciated for a given lithographic process, at a given node there will be a minimum size of feature it is possible to form reliably using said lithographic process. This may correspond to a single pixel in the circuit layout. As such, a circuit 206; . . . ; 212, formed by a lithographic process may be said to have a characteristic resolution corresponding to that lithographic process, where the characteristic resolution is typically said minimum feature size. It will be appreciated that the minimum separation of two features may be less (or a non-integral multiple) of the minimum feature size. Additionally, or alternatively, a given feature in the circuit may be larger than the minimum feature size by a non-integral multiple of the minimum feature size.

For example, with e-beam lithography the minimum feature size is typically determined by the "spot" size of the electron beam (or diameter of the electron beam on the surface of the resist). However, for an electron beam of a given "spot" size the minimum step size (or minimum distance a given electron beam can be reliably displaced relative to the resist) may be less than the "spot" size.

It is well-known that various parameters of a given lithographic process may be tuned to realize different nodes. For example, in photolithography any of: the wavelength of the light used; the refractive index of the medium in which the light travels; and so on, may be changed to obtain different nodes.

Figure 2B:
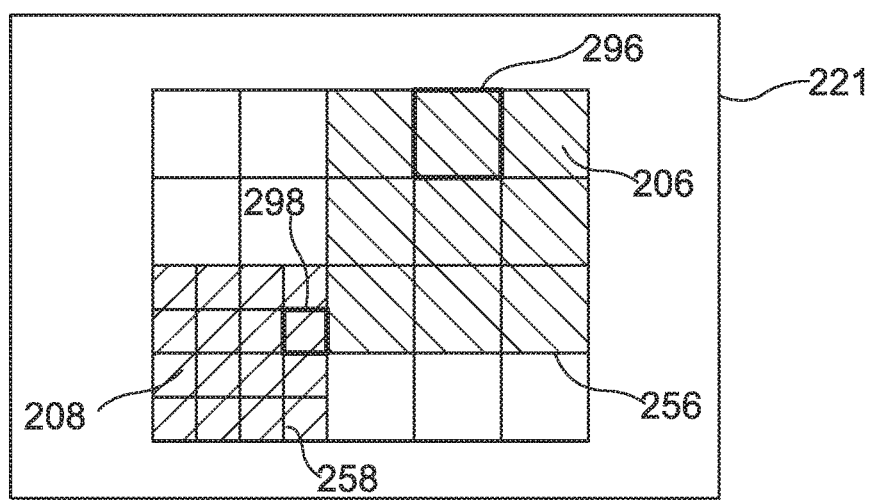
FIG. 2B schematically illustrates the surface of a silicon chip according to an embodiment of the invention.

FIG. 2B schematically illustrates the surface of a silicon chip 221 according to an embodiment of the invention. FIG. 2B shows the silicon chip 221 having thereon a first circuit 206 and a second circuit 208. As described previously, each circuit 206; 208 typically corresponds to a respective logic block 106, . . . , 116 of a system 100 which is implemented on the silicon chip 221.

The first circuit 206 has been formed on the chip using a first lithographic process. The first lithographic circuit has (or is at) a first characteristic resolution 256. The first characteristic resolution 256 is illustrated FIG. 2B as a notional coarser grid. The first characteristic resolution 256 is typically determined by the first lithographic process as set out previously. In particular the first characteristic resolution 256 is usually based on the node of the first lithographic process. FIG. 2B also shows a schematic example of a functional element 296 of the first circuit 206 at the first characteristic resolution 256.

The second circuit 208 has been formed on the chip using a second lithographic process. The second lithographic circuit has (or is at) a second characteristic resolution 258 that is finer than the first characteristic resolution 256. The second characteristic resolution 258 is illustrated FIG. 2B as a notional finer grid. The second characteristic resolution 258 is typically determined by the second lithographic process as set out previously. In particular the second characteristic resolution 258 is usually based on the node of the second lithographic process. FIG. 2B also shows a schematic example of a functional element 298 of the second circuit 208 at the first characteristic resolution.

It will be appreciated that there are many ways in which an attacker looking to clone the silicon chip 221 may attempt to do so. These typically involve slowly removing material from the surface of the chip 221, and imaging the surface of the chip 221 in order to attempt to recover the circuit layouts corresponding to the circuits 206; 208 on the chip 221. The recovered circuit layouts may then be analysed to ascertain their functionality, or simply reproduced to form a cloned chip.

When cloning a chip an attacker would typically use a different lithographic process (usually with a different minimum feature size, and/or minimum feature separation etc.). This means that the recovered circuit layout cannot simply be copied, but instead must be post processed so as to try and create a functionally equivalent circuit layout, suitable for use with the different lithographic process. Usually this requires pattern recognition to be applied to the recovered circuit layout to identify the particular structural features, and generate an equivalent circuit layout. Additionally, in order to reliably image the minimum feature size the initial imaging of the circuit layout by the attacker needs to be at a much higher resolution than the minimum feature size. This however, captures the usual manufacturing variations in the circuit itself (which the attacker considers to be noise). Therefore, the attacker will typically limit the resolution of the processing applied to the initial image based on the node of the chip 221. This may be done, for example, by tuning the processing to disregard features in the initial image, that are smaller than would be expected given the node of the chip 221. In other words, an attacker would set up the reverse engineering process to disregard features that are smaller than the characteristic resolution for the chip 221. Given the need for high resolution initial images, and further post processing the cloning process gets progressively more difficult, inaccurate and expensive, the smaller the node of the chip 221. Reverse engineering techniques for semiconductor chips are well known in the art and are, for example, described in "*The state-of-the-art in semiconductor reverse engineering*", R. Torrance and D. James, Design Automation Conference (DAC), 48th ACM/EDAC/IEEE, (2011), pp 333-338, and "*Reverse Engineering of CMOS Integrated Circuits*", G. Masalskis and R. Navickas, Electronics and electrical engineering, 8(88), (2008), pp 25-28, both of which are incorporated herein by reference in their entirety.

The second characteristic resolution 258 is usually chosen such that at least one functional element 298 of the second circuit 208 (typically a functional element at the second characteristic resolution) is not resolvable (or otherwise identifiable) at the first characteristic resolution 256. Additionally or alternatively, the second characteristic resolution 258 may be chosen such that a set of functional elements 298 of the second circuit 208 is not resolvable (or otherwise identifiable) at the first characteristic resolution.

Typically, a functional element 298 is not resolvable at a characteristic resolution if a reverse engineering process for a chip formed at the characteristic resolution cannot identify said functional element. As set out above, this is typically due to said functional element 298 not being resolved in the initial imaging of the chip and/or being filtered out (or discarded) during a post processing step of the reverse engineering process. It will be appreciated that a functional element may considered to be not resolvable at a characteristic resolution if a reverse engineering process for a chip formed at the characteristic resolution wrongly identifies (or fails to characterize) said functional element. For example, the reverse engineering process may determine that a given functional element is present but incorrectly determine one or more of the dimensions (such as a length) of the functional element. This often occurs due to the one or more of the dimensions of the functional element being not reproducible with a lithographic process at the characteristic resolution, and hence the further processing assuming a reproducible offset. In this way the reverse engineering process would typically produce a circuit layout with a functional element 298 having an incorrect dimension leading to a circuit that operates differently to the circuit that was intended to be cloned.

It will be appreciated that a set of functional elements 298 may be considered not resolvable at a characteristic resolution, in a similar manner. In other words, if one or more functional elements 298 of the set of functional elements 298 is not resolvable (or otherwise identifiable) at the characteristic resolution. Additionally, or alternatively, a set of functional elements 298 may be considered not resolvable at a characteristic resolution if an offset (or distance between) two or more functional elements 298 of the set is not resolvable (or otherwise identifiable) at the characteristic resolution. An offset between two or more functional elements 298 is not resolvable if a reverse engineering process for a chip formed at the characteristic resolution either fails to identify the offset, or identifies an incorrect offset (such as one that is too large or too small). This often occurs due to offset being not reproducible with a lithographic process at the characteristic resolution, and hence the further processing assuming a reproducible offset (or simply filtering out the offset). In this way the reverse engineering process would typically produce a circuit layout with incorrect positioning of the two or more functional elements 298 leading to a circuit that operates differently to the circuit that was intended to be cloned.

This has the effect of making it much more difficult for an attacker attempting to reverse engineer the silicon chip 221, as any reverse engineering of the chip 221 using a resolution corresponding to the node of the first lithographic process will typically not allow identification of features of the second circuit 208. For example, an attacker looking to reverse engineer the chip 221, will often not reliably resolve features of the second circuit in the initial image, leading to the cloned chip lacking these features. Even should the features of the second circuit be resolved in the initial image, then the attacker's own post processing would usually be tuned so as to disregard these features (such as incorrectly identifying them as random noise arising from the manufacturing process), leading to the cloned chip lacking these features. As such, any reverse engineering or cloning of this type would likely fail as the recovered circuit layouts and/or cloned chips would be incomplete.

In other words, the first lithographic process typically introduces "noise" (or manufacturing variations) in the first circuit. The circuit variations due to noise are generally proportional to the node size (as typically a lower noise would enable a smaller node size). Hence, as set out previously, when an attacker is reverse engineering the chip it would seem desirable to the attacker to ignore any structures made at a smaller scale using the second lithographic process. This is because the attacker will usually be unaware that the second lithographic process has been used and will assume that these structures are "noise" from the first lithographic process. The noise in the second lithographic process is typically smaller than that of the first lithographic process. As such it will be appreciated that in referring to characteristic resolutions these could instead be characteristic noise margins, where a greater resolution would correspond to a smaller noise margin and vice versa.

The first lithographic process may comprise a mask based lithographic process. By way of an example, the first lithographic process may be an optical (UV) lithographic process. This optical (UV) lithographic process might be arranged to have a node of 45 nm, giving a minimum feature size (and characteristic resolution) of 18 nm. The functional element 296 may be approximately an 18 nm square.

The second lithographic process may comprise a maskless lithographic process. Alternatively, the second lithographic process may comprise a mask based process (such as an optical (UV) lithographic process).

By way of example, the second lithographic process may be an e-beam lithographic process. This e-beam lithographic process might be arranged to have a typical node size of 22 nm, giving a minimum feature size (and characteristic resolution) of 9 nm. The functional element 298 may be approximately an 9 nm square. As a result, imaging the silicon chip 221 with an reverse engineering process corresponding to the 45 nm node will not properly resolve any of the 9 nm features.

The circuits shown in FIG. 2B are shown as non-overlapping for ease of understanding, however the skilled person would appreciate that this is not a limitation and that such circuits may overlap, and such overlaps may occur at different layers of the chip 221.

In order to increase the resistance of the silicon chip 221 to reverse engineering it may be preferable that only a small number of circuits 206; 208 are applied using the second lithographic process. This ensures that the chip 221 still appears to a hacker to be manufactured using the first lithographic process (with the coarser characteristic resolution 256). Typically, the circuits 206; 208 applied using the second lithographic process correspond to logic blocks 106, . . . , 116 that are required to be secured themselves, as set out previously. This presents the added advantage of any reverse engineering done by an attacker will not yield information (such as embedded cryptographic keys) regarding these logic blocks 106, . . . , 116.

Figure 3:
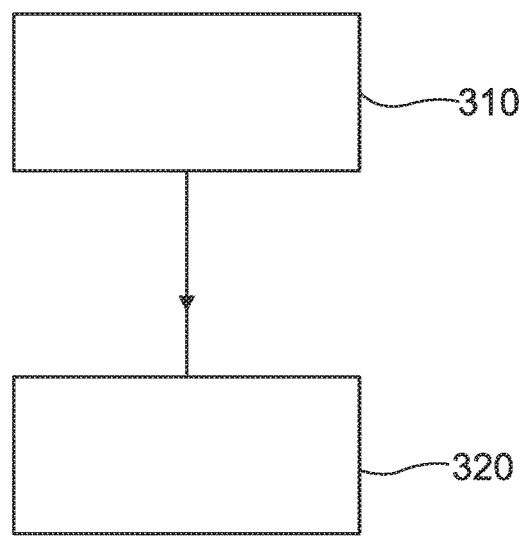
FIG. 3 shows a flow chart of a method of manufacturing a silicon chip, such as the example silicon chip of FIG. 2B, according to an embodiment of the invention.

FIG. 3 shows a flow chart of a method 300 of manufacturing a silicon chip 221, such as the example silicon chip 221 described above, according to an embodiment of the invention.

At a step 310 a first circuit layout is applied to a semiconductor substrate (such as a silicon wafer). The first circuit layout is applied using a first lithographic process having a first characteristic resolution 256. For example, the first lithographic process may be mask based (such as optical (UV) lithography). This step 310 results in the formation of a first circuit 206 on the chip 221.

At a step 320 a second circuit layout is applied to the semiconductor substrate. The second circuit layout is applied using a second lithographic process having a second characteristic resolution 258. For example, the second lithographic process may be beam steered (such as e-beam). Beam steered should be understood to mean a lithographic process where custom shapes may be drawn on the resist, without the use of a mask such as by scanning with an electron beam (In other words, a maskless lithographic technique).

It will be appreciated that each of the steps 310 and 320 may themselves involve further subs-steps according to the lithographic technique chosen. Such further sub-steps would be apparent to those skilled in the art.

Additionally, each of the steps 310 and 320 may be repeated any number of times, independently of each other, so as to form any number of different circuits 206; 208.

It will be appreciated that the method 300 and the silicon chip 221 above may also be used to form a single functional semiconductor layer in a 3D integrated circuit (such as those made by stacking silicon wafers, or monolithic 3D integrated circuits) without substantial modification. As such 3D integrated circuits are well-known, further detail shall not be provided herein. However, more information can be found at, for example, https://en.wikipedia.org/wiki/Three-dimensional_integrated_circuit the entire contents of which are incorporated herein by reference.

As discussed previously, semiconductor chips typically comprise multiple layers of different materials, such as oxide layers, polysilicon layers, metal layers and so on. Each layer typically has a respective circuit applied to it using a lithographic process common to the whole chip. Whilst the lithographic process may use the same node for every layer in the chip, it is known to increase the feature size for higher layers, for instance to reduce alignment errors. FIG. 4A schematically illustrates an exploded view of a semiconductor chip 421 having a system 100 (such as the system 100 of FIG. 1) implemented thereon. The semiconductor chip 421 comprises three layers 421-1; 421-2; 421-3. It will be appreciated that this number of layers 421-1; 421-2; 421-3 is merely exemplary and any number of layers may be used in practice. The FIG. 4A also shows a set of circuits 206-1; 206-2. Each circuit corresponds to a respective layer 421-1; 421-2. The layers 421-1; 421-2; 421-3 typically correspond to the various layers of materials found in semiconductor chips known to the skilled person. For example, each layer may be any one of an oxide layer, a polysilicon layer, a metal layer and so on.

The layers 421-1; 421-2 each comprise a respective circuit 206-1; 206-2 that has been formed on the layer 421-1; 421-2 using a first lithographic process. The first lithographic process has a first characteristic resolution as set out previously.

This first characteristic resolution may correspond to a set or range of coarser resolutions. Each respective layer 421-1; 421-2; 421-3 may have a different coarser resolution from within the range of coarser resolutions. Typically, starting from the base layer 421-3 the first characteristic resolution increases for each subsequent, higher, layer. As set out above, it is well-known to manufacture semiconductor chips, the resolution of a given lithographic process at a particular node is typically increased (usually monotonically) for each higher layer. In this way, the base (or lowest) layer typically is processed using the minimum resolution that would correspond to the particular node.

Each circuit 206-1; 206-2 has been formed on the respective layer 421-1; 421-2 using the first lithographic process having (or at) the respective coarser resolution 456-1; . . . ; 456-3 of the set or range of coarser resolutions.

Figure 4B:
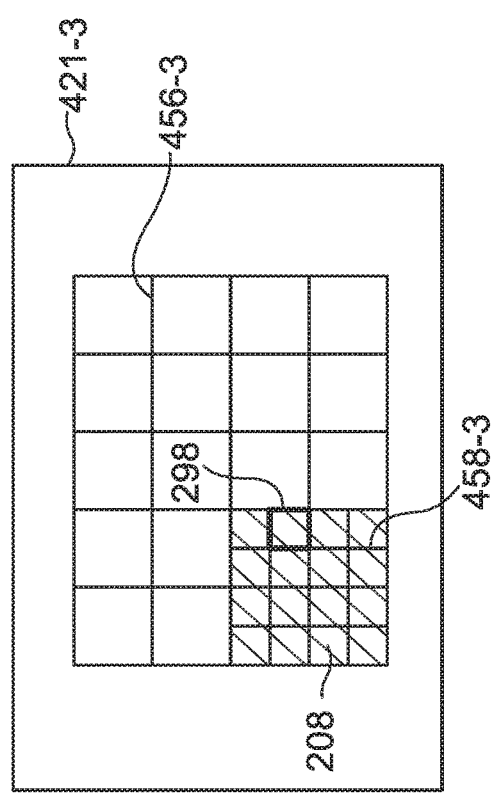
FIG. 4B schematically illustrates a layer of the semiconductor chip of FIG. 4A.
Figure 4A:
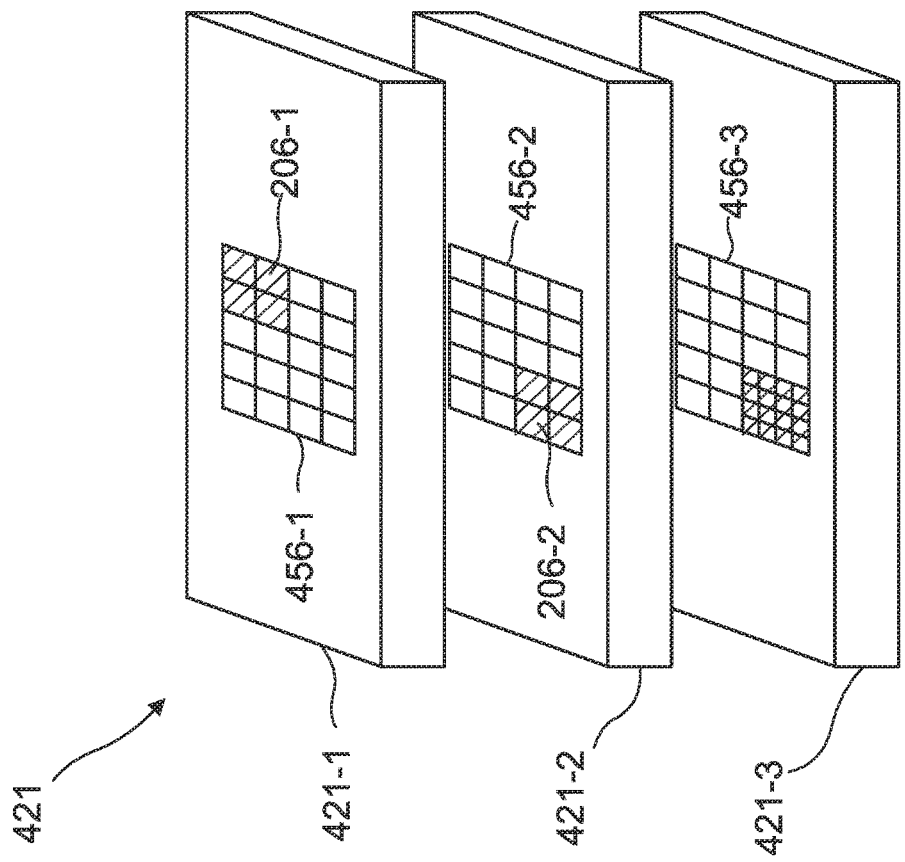
FIG. 4A schematically illustrates an exploded view of a semiconductor chip, according to an embodiment of the invention.

FIG. 4B schematically illustrates the layer 421-3 of the semiconductor chip 421. The layer 421-3 comprises a circuit 208 that has been formed on the layer 421-3 using a second lithographic process. The second lithographic process has a second characteristic resolution as set out previously. Similarly, this second characteristic resolution typically corresponds to a range of finer resolutions. Each respective layer 421-1; 421-2; 421-3 may have a different finer resolution 458-1; . . . ; 458-3 from within the range of finer resolutions. Typically, starting from the base layer 421-3, the respective finer resolution 458-3 is increased for each subsequent, higher, layer 421-1; 421-2.

The circuit 208 has been formed on the layer 421-3 using the second lithographic process having (or at) the respective finer resolution 458-3 of the range of finer resolutions.

The second characteristic resolution is typically chosen such that at least one functional element 298 of the circuit 208 (typically a functional element at the respective finer resolution corresponding to the layer 421-3) is not resolvable at the respective coarser resolution corresponding to the layer 421-3. Additionally or alternatively, the second characteristic resolution may be chosen such that a set of functional elements 298 of the second circuit 208 is not resolvable (or otherwise identifiable) at the respective coarser resolution corresponding to the layer 421-3.

This has the effect of making it much more difficult for an attacker attempting to reverse engineer the silicon chip 421, as any reverse engineering of layer 421-3 using a reverse engineering process tuned for the respective coarse resolution (i.e. the resolution an attacker looking at the rest of the chip would expect) will typically not allow identification of (and would therefore omit) features of the circuit 208 in a way analogous to that described above with reference to FIGS. 2A and 2B. As such, any reverse engineering or cloning of this type would likely fail as the recovered circuit layouts and/or cloned chips would be incomplete.

The above example has shown the circuit 208 being applied with the second lithographic process to the base layer 421-3, with the circuits 406-1; 406-2 applied with the first lithographic process to higher layer. The skilled person would appreciate that the circuit 208 could be applied with the second lithographic process to any layer 421-1; 421-2; 421-3 using at the respective finer resolution 458-1; . . . ; 458-3 of the range of finer resolutions. This would still typically provide an effective countermeasure. However, in order to provide additional resilience, the second characteristic resolution may be chosen such that at least one functional element 298 (or a set of functional elements as set out previously) of the circuit 208 (typically a functional element at the respective finer resolution 458-3 corresponding to the layer 421-3) is not resolvable at any respective coarser resolutions 456-1; . . . 456-3 falling within the range of coarser resolutions.

It will be appreciated that circuits 206-1; 206-2; 208 on different layers 421-1; 421-2; 421-3 may in various combinations provide the functionality of (or part of) one or more logical blocks 106; . . . ; 116 of the system 101 implemented on the chip 421. In particular, the skilled person would appreciate that combinations of the circuits 206-1; 206-2; 208 on different layers 421-1; 421-2; 421-3 may provide various components (such as transistors) used in providing said functionality.

Figure 5:
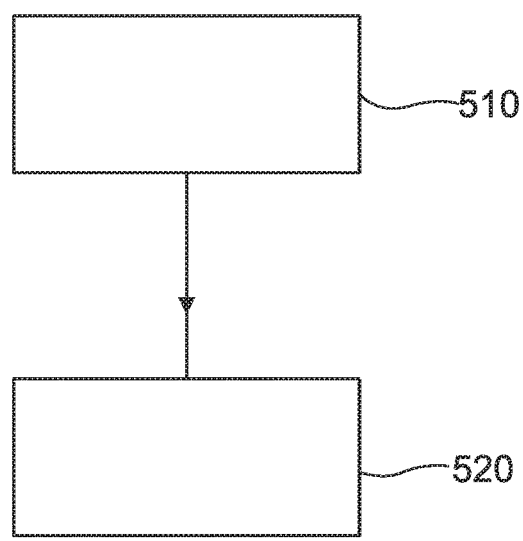
FIG. 5 shows a flow chart of a method of manufacturing a silicon chip, such as the example silicon chip of FIGS. 4A and 4B, according to an embodiment of the invention.

FIG. 5 shows a flow chart of a method 500 of manufacturing a silicon chip 421, such as the example silicon chip 421 described above, according to an embodiment of the invention.

At a step 510, for one or more layers of the silicon chip, a respective circuit layout from a first set of circuit layouts is applied to the layer. The respective circuit layout is applied using a first lithographic process having a respective coarser resolution falling within the range of coarser resolutions. This step 310 results in the formation of a respective circuit at said respective coarser resolution on each of the one or more layers.

At a step 520 a circuit layout is applied to the layer. The respective circuit layout is applied using a second lithographic process having a respective finer resolution falling within the range of finer resolutions. This step 310 results in the formation of the circuit at said finer resolution on the layer.

It will be appreciated that each of the steps 510 and 520 may themselves involve further subs-steps according to the lithographic technique chosen. Such further sub-steps would be apparent to those skilled in the art.

Additionally, each of the steps 510 and 520 may be repeated any number of times, independently of each other, so as to form any number of different circuits.

Figure 6A:
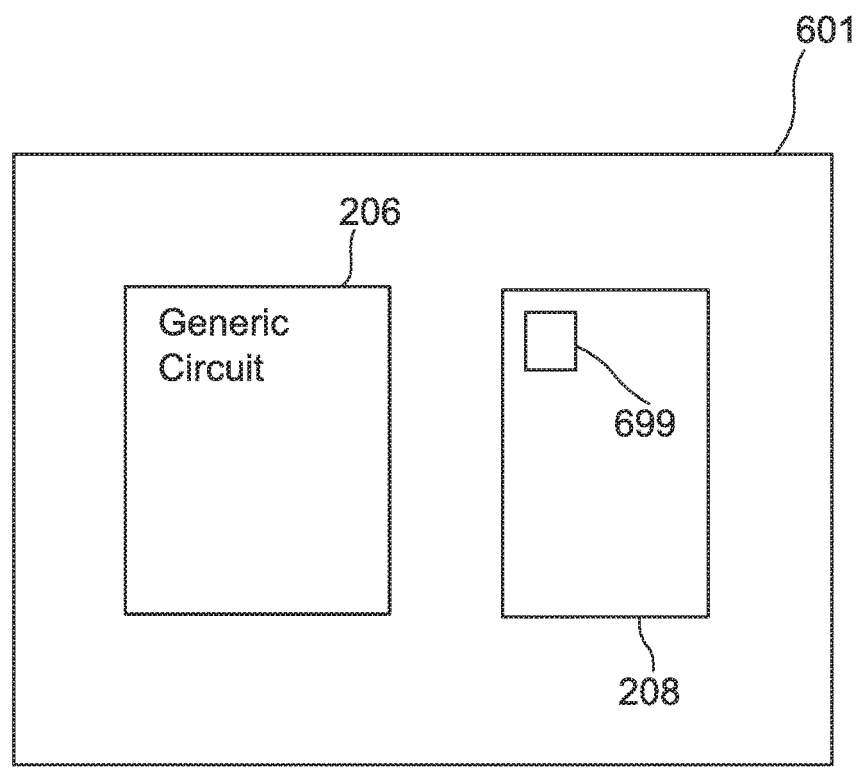
FIG. 6A schematically illustrates an example individualized silicon chip according to an embodiment of the invention.

FIG. 6A schematically illustrates an example individualized silicon chip 601 according to an embodiment of the invention. The individualized silicon chip 601 comprises a generic circuit 206 and an individualized circuit 208.

The individualized circuit 208 comprises (or embeds or provides in the chip) individualization data 699. The individualization data 699 may comprise an identifier for the chip 699. The individualization data 699 may comprise secret data (as described previously), such as any of: a cryptographic key, part of a cryptographic key, a cryptographic seed, a certificate, a cryptographic signature, and so on. The individualized circuit 208 may implement functionality, such as a security operation as described previously. Where the individualized circuit 208 implements a security operation, said security operation may be arranged to use the individualization data 699.

For example the security operation may be a decryption (and/or encryption) operation, and the individualization data 699 may be a corresponding cryptographic key. Similarly, the security operation may be a signature generation (and/or verification) operation and the individualization data may be a corresponding signature (and/or signature verification) key, or certificate or such like.

Additionally, or alternatively the generic circuit 206 may implement a security operation arranged to use the individualization data 699 as set out above.

The individualized silicon chip 601 is typically part of a batch of silicon chips 601 Each silicon chip 601 of the batch of silicon chips comprises the generic circuit 206. For each individualized silicon chip 601 in the batch of silicon chips 601 the respective individualized circuit 206 embeds the respective individualization data 699. The individualization data 699 for a given chip 206 is usually unique with respect to the respective individualization 699 data of each other silicon chip 206 of the batch. In other words, each chip 206 of the batch may be identified by the respective individualization data 699.

The generic circuit 206 typically implements functionality common to the batch of chips 601. For example, the generic circuit 206 may implement a system such as system 100 described previously. The generic circuit 206 is usually formed on the silicon chip 601 using a mask based lithographic process. For example, the generic circuit 206 may be formed on the silicon chip 601 using optical lithography, such as UV optical lithography. The use of a mask based process allows the generic circuit 206, typically common to all chips 601 in the batch, to be applied efficiently and at low cost, as one mask may be used for all of the chips 601 in the batch.

Typically, the individualized circuit 208 is formed on the silicon chip 601 using a beam steered lithographic process.

For example, the generic circuit 206 may be formed on the silicon chip using e-beam lithography. The use of a beam steered lithographic process allows the respective individualized circuits 208 to be applied to each individualized chip 601 without the need for a stepper based individualization process using multiple mask variants or producing a costly, one-off, mask for each individual chip. The skilled person will appreciate however, that the individualized circuit 208 may, alternatively, be formed on the silicon chip 601 using a mask based process (such as an optical (UV) lithographic process).

The individualized chip 601 may be formed in accordance with the methods and embodiments described above, with reference to FIGS. 2A-4. In particular, the generic circuit 206 may be formed using the first lithographic process at the first characteristic resolution, and all (or part of) the individualized circuit 208 may be formed using the second lithographic process at the second characteristic resolution, as described above with reference to FIGS. 2A-4. This provides the combined advantages that the individualized chip 601 also has an improved resistance to reverse engineering. This is since the individualized circuit 208 (which may embed secret data) is made more difficult to image by an attacker. Therefore, a cloned individualized chip produced by an attacker is likely to be missing the functionality that provides the individualization data 699.

The generic circuit 206 may implement a number of different functionalities, or logic modules 106; . . . , 116. The generic circuit 206 may also determine which of the number of different functionalities is enabled for a particular chip 601 based on a respective enablement vector. The individualization data 699 may comprise the respective enablement vector.

The use of such enablement vectors to limit the functionality of a specific chip in a batch of generic chips (i.e. such selective enablement of functional modules) is well-known in the art we do not discuss it further herein. However, more information on such selective enablement can be found in, for example, co-pending application WO 2014/056515 A1, the entirety of which is incorporated herein by reference. In particular, the skilled person would be aware of the prior art described on page 1 line 29 to page 2, line 25 of WO 2014/056515 A1, and would recognise the values of the OTP memory locations e1, . . . , e2 as forming an example of such an enablement vector.

Additionally, or alternatively, enablement vectors may be supplied to the chip separately to allow the enabling and/or disabling of features after the chip has been manufactured. In this case, the enablement vector may be cryptographically authenticated using the individualization data 699. The individualization data 699 may be any of: a signature verification key, an ID, a certificate etc. that could be used to verify the authenticity of the enablement vector in any of the ways commonly known in the art (such as a cryptographic signature scheme).

Figure 6B:
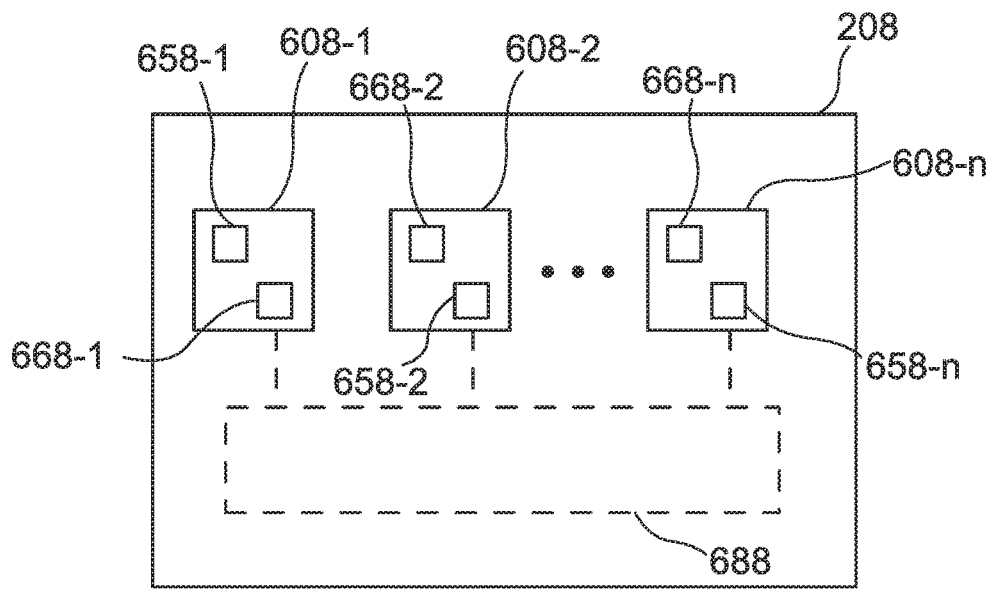
FIG. 6B schematically illustrates an example individualized circuit according to an embodiment of the invention, such as may be present in the example chip of FIG. 6A.

FIG. 6B schematically illustrates an example individualized circuit 208 according to an embodiment of the invention, such as may be present in the example chip 601 described above. The individualized circuit 208 is shown as comprising a plurality of circuits 608-1; 608-2; . . . ; 608-n. It will be appreciated that the individualized circuit 208 may implement functionality additional to the plurality of circuits 608-1; 608-2; . . . ; 608-n, or in some cases may simply be considered to be (or be replaced by) the plurality of circuits 608-1; 608-2; . . . ; 608-n. As set out previously, each circuit 608-1; 608-2; . . . ; 608-n of the plurality of circuits typically corresponds to a respective circuit layout. The respective circuit layout is applied to the silicon chip 601 to form said circuit.

For ease of understanding a single circuit 608-n of the plurality of circuits is described. It will be appreciated that said description equally applied to the other circuits 608-1; 608-2; . . . .

The circuit 608-n comprises two triggered states 658-n; 668-n. The two triggered states 658-n; 668-n are usually the possible outputs (or outcomes) of triggering the circuit 608-n. Each state 658-n; 668-n may be a steady state. In other words the circuit remains in the state in the absence of external interaction. Alternatively, each state 658-n; 668-n may be an instantaneous state such as a possible output of a function (or operation) implemented by the circuit. Typically, the circuit, when triggered may fall into either one of the two triggered states 658-n; 668-n. Triggering the circuit may correspond to powering up the circuit and/or the chip as a whole. Additionally, or alternatively, triggering the circuit may comprise supplying (or applying or inputting) a trigger signal to the circuit.

One of the triggered states 658-n; 668-n of the circuit 608-n is a preferred state 658-n. That is, the circuit 608-n will fall into (or result in) the preferred state 658-n with a greater likelihood than the other state 668-n when triggered. In other words, when the circuit 608-n is triggered, the outcome of the preferred state 658-n is more likely than the outcome of the other state 668-n. The circuit layout corresponding to the circuit 608-n selects (or defines or otherwise choses) the preferred state 658-n. In this way it will be appreciated that it is the design of the circuit layout that determines which of the states of the eventual circuit is to be the preferred state. This is usually achieved by biasing the circuit layout in favour of a preferred state. In this way the circuit layout may be considered to be a biased circuit layout. Examples of how to achieve the required bias are provided below.

It will be appreciated that when applying the circuit layout to form the circuit 608-n various manufacturing variations (such as those used by the fingerprinting method of the prior art set out previously) may introduce an additional bias into the circuit with respect to one of the states 658-n; 668-n. However, according to an embodiment of the present invention, the bias in the circuit layout is typically arranged to be much larger than any possible additional bias introduced by manufacturing.

The plurality of respective preferred states 658-1; 658-2; . . . ; 658-n of the circuits 608-1; 608-2; . . . ; 608-n in the plurality of circuits encode (or represent or store) the individualization data 699. Typically, each preferred state 658-1; 658-2; . . . ; 658-n represents a bit value of the individualization data 699. It will be appreciated that because the preferred states 658-1; 658-2; . . . ; 658-n are defined by the biased circuit layouts, any arbitrary individualization data may be encoded in the plurality of circuits.

It will be appreciated that if the respective bias in each circuit layout (and therefore each circuit 608-1; 608-2; . . . ; 608-n) is very large then, to a high degree of confidence, simply triggering each circuit 608-1; 608-2; . . . ; 608-n would be sufficient to recover (or read) the individualization data 699. The individualization data 699 may be encoded using an error correction scheme (such as any of a Reed Solomon error correction code, a Hamming error correction code, etc.) that is well known in the art. This would make the encoded individualization data 699 resistant to a number of bit errors (such as errors caused by a triggered circuit 608-1; 608-2; . . . ; 608-n not falling into the respective preferred state 658-1; 658-2; . . . ; 658-n which will arise due to noise, for example arising from thermal variations). The skilled person would appreciate how to adjust the various parameters of the error correction scheme used, to account for the particular biases selected for a particular plurality of circuit layouts. Typically, the smaller the biases involved the higher the expected bit error rate when the circuits are triggered. For large biases the expected bit error rate may be so low that no error correction is used. Alternatively an error detection circuit may be used (such as a parity check) to allow the circuits to be re-triggered when an error is detected.

As such, an optional circuit 688 may be used to apply an error correction scheme to the plurality of triggered stets obtained when the plurality of circuits are triggered, thus enabling the recovery of the individualization data 699.

By way of an example, each circuit 608-n may be a respective memory cell, such as a SRAM memory cell. Such a memory cell would have two states 658-n; 668-n corresponding to a bit value of "1" or "0" respectively. When powering up each memory cell, the memory cell would either fall into state "1" or state "0". By biasing the respective circuit layout of each memory cell, arbitrary individualization data may be encoded in the most likely (or preferred) bit values of the plurality of memory cells. When the memory cells are triggered, an error correction (or simple error detection) scheme may be applied to the resultant triggered states of the memory cells to recover the individualization data 699.

It will be appreciated that the states are not limited to stable (or otherwise held states) such as those in the memory cells discussed above. The states may correspond to various output signals produced (or generated) by the circuit in response to an input signal (or trigger).

Figure 6C:
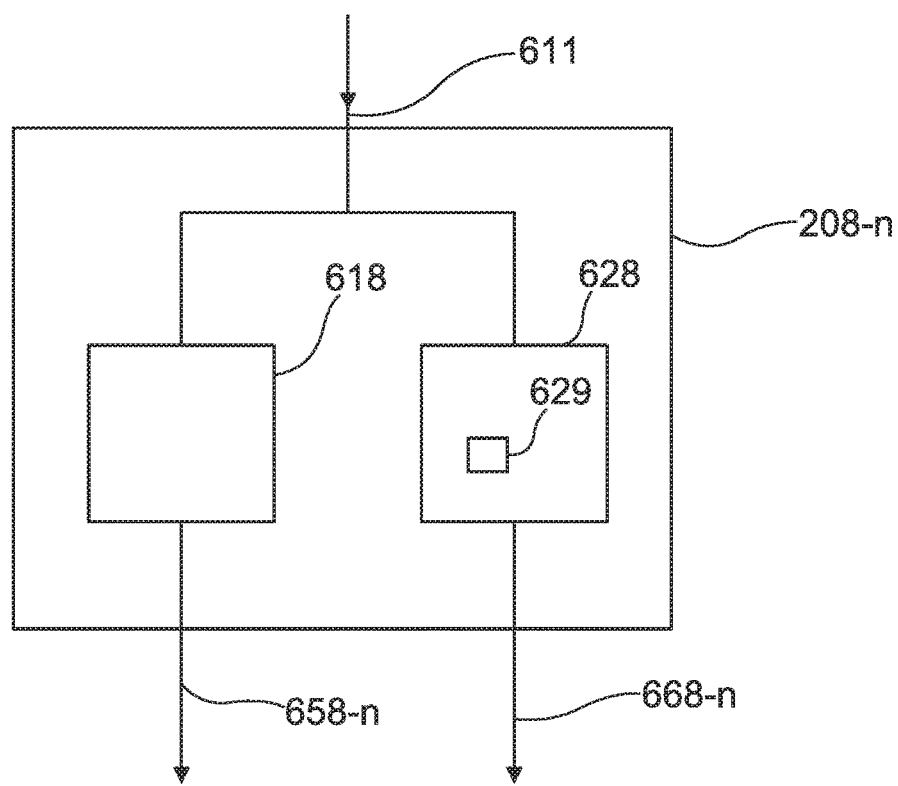
FIG. 6C schematically illustrates an example circuit according to an embodiment of the invention, such as may be present in the example chip of FIGS. 6A and 6B.

FIG. 6C schematically illustrates an example circuit 208-n according to an embodiment of the invention, such as may be present in the example chip 601 described above. The circuit 208-n comprises two respective variant sub-circuits 618; 628. Also shown is a trigger (or input) signal (such as that described above) 611 and two possible triggered states 658-n; 668-n in the form of respective output signals 658-n; 668-n.

The circuit layout corresponding to the circuit 208-n comprises two variant sub-circuit layouts. Each variant sub-circuit is applied using the respective variant sub-circuit layout.

As set out previously, the circuit layout defines a preferred state 658-n of the circuit. In particular the variant sub-circuit layout corresponding to the variant sub-circuit 628 comprises a circuit layout variation with respect to the other variant sub-circuit layout. Typically, the variant sub-circuit layouts are otherwise identical. The circuit layout variation may be selected from any number of possibilities, for example any of a dimension of a gate; a dimension of a source; a dimension of a drain; a characteristic of a resistor; a characteristic of a capacitor; and a characteristic of a connection. Typically, a circuit layout variation gives rise to a change in the performance or functionality of the circuit (or a component of the circuit such as a transistor). For example, a circuit layout variation may comprise a displacement of one or more functional elements of the circuit. In the case of a transistor the circuit layout variation may comprise the shifting of a gate relative to a source (and/or a drain) or vice versa. This may give a noticeable change in transistor characteristics even if the gate size remains unchanged. The effect of such variations on the functionality of the variant sub-circuit layout would be something that would be apparent to the skilled person and they would be able simply to select the most appropriate variation.

The circuit layout variation in the variant sub-circuit layout would cause the corresponding variant sub-circuit 628 to comprise a circuit variation 629 with respect to the other variant sub-circuit 618. In this way the trigger signal would be processed differently by each variant sub-circuit 618; 628, causing one output signal 658-n; 668-n to be preferred (or more likely) with respect to the other output signal 658-n; 668-n.

For example, the skilled person would appreciate that a circuit variation 629 corresponding to a lengthening of a connection would alter one or more capacitance values in the corresponding variant sub-circuit 628. This could slow the operation of the corresponding variant sub-circuit 628. As such a trigger signal applied to both the variant sub-circuits 618; 628 would, on average take longer to travel through the variant-sub circuit 628. This would mean that, on average, the output signal 668-n would occur after the output signal 658-n, making output signal 658-n the preferred state. In other words, a "race condition" between the sub-circuits may be created (or enabled), with a bias leading to the preferred output signal 658-n being the more likely output.

The skilled person would appreciate that this is only one of a myriad of possible example implementations and others would be immediately apparent when implementing the invention.

As set out above, the individualized chip, described with respect to any of FIGS. 6A-6C, may be formed in accordance with the methods and embodiments described above, with reference to FIGS. 2A-4. In particular, the generic circuit 206 may be formed using the first lithographic process at the first characteristic resolution, and all (or part of) the individualized circuit 208 may be formed using the second lithographic process at the second characteristic resolution, as described above with reference to FIGS. 2A-4.

It will be appreciated that the use of the methods and embodiments described above, with reference to FIGS. 2A-4, for forming the individualized chip described with reference to FIG. 6C is particularly advantageous. In particular, the variant sub-circuit 628 may be applied with the second lithographic process at the second characteristic resolution. This enables the circuit layout variation to define a difference of the variant sub-circuit 628 with respect to the other variant sub-circuit 618 that cannot be resolved at the first characteristic resolution.

In this way, an attacker looking to clone the individualized chip, using a reverse engineering process tuned for the first lithographic process at the first characteristic resolution would likely wrongly identify the difference of the variant sub-circuit 628 with respect to the other variant sub-circuit 618 as simply "noise" (or manufacturing variations due to the first lithographic process). As such, the circuit layout variation would likely not be recovered by the attacker. Thus, leading to the cloned chip not possessing the correct biases (and therefore, not being enabled to reproduce the correct identification data).

In other words, the use of the second lithographic process at the second characteristic resolution enables the introduction of pre-determined variations in the variant sub-circuits of the same size as the manufacturing variations typically expected from the first lithographic process. Given this, the skilled person would appreciate that in this way the biases, and hence the individualization data 699, may be introduced using circuit variations analogous to the manufacturing variations that cause the biases in PUFs. In this way biased sub-circuits, such as those present in any of: Butterfly PUFs, Bistable ring PUFs, SRAM PUFs, Delay PUFs, and so on may be formed to embed the particular individualization data 699.

Figure 7A:
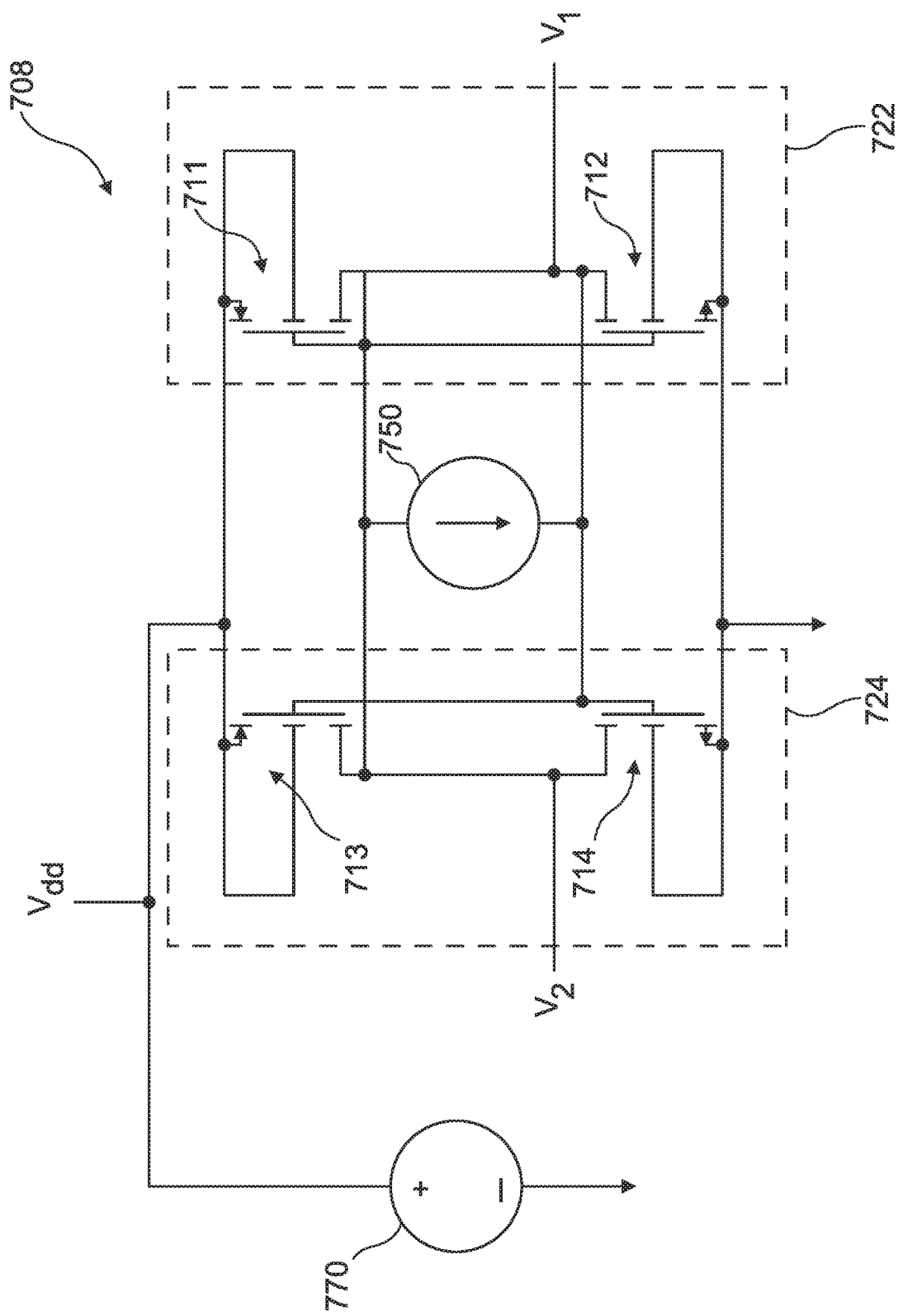
FIG. 7A shows a schematic of an example circuit layout according to an embodiment of the invention, that may be used as a generic or individualized circuit as described in FIGS. 6A-C.

FIG. 7A shows a schematic of an example circuit layout 708 according to an embodiment of the invention, that may be used as a generic or individualized circuit as described above. The circuit 708 comprises four transistors 711; 712; 713; 714.

The transistor 711 and the transistor 712 form a first invertor 722. Similarly, the transistor 713 and the transistor 714 form a second invertor 724. The first and the second invertors are coupled such that the output of the first invertor is fed to the input of the second invertor and the output of the second invertor is fed to the input if the first invertor.

It will be appreciated that this coupled set of invertors is one that may be used as part of an SRAM cell, however for ease of understanding the programming logic and other parts of the circuit layout needed to read out the value of the SRAM are not shown.

Also shown in FIG. 7A is a voltage source 770, and a current source 750. The voltage source 770 is used to provide the voltage to operate the circuit in the simulations described below. The current source 750 is used to provide random noise to the inputs and outputs of the two invertors 722 and 724 in the simulations below. It will be appreciated that this current source is therefore only present to allow the simulations below to include the effects of thermal noise in the modelling of the circuit 708. As such the current source 750 should not be considered as part of the circuit layout actually used in producing chips according to an embodiment of the invention.

A voltage applied to a circuit following the example circuit layout 708 will cause the circuit to power up. The circuit will then fall into one of two stable states. A first state would correspond to the voltage across $V_{dd}$ and $V_1$ being equal to the voltage supplied to the circuit (such as by the voltage source 770), and the voltage across $V_{dd}$ and $V_2$ being equal to zero. A second state would correspond to the voltage across $V_{dd}$ and $V_2$ being equal to the voltage supplied to the circuit (such as by the voltage source 770), and the voltage across $V_{dd}$ and $V_1$ being equal to zero. If each of the transistors 711; 712; 713; 714 in the circuit were identical then the probability of the circuit falling into the first state on power up would be equal to the probability of the circuit falling into the second state. As an example, if the first lithographic process is a 35 nm process, each of the transistor layouts 711; 712; 713; 714 might have a gate width of 35 nm and a gate length of 100 nm. As set out previously though, even if the transistors 711; 712; 713; 714 in the circuit layout 708 were identical then manufacturing tolerances would typically result in the transistors 711; 712; 713; 714 on the resulting chip differing slightly, resulting in a preference for either the first or the second state on power up of the actual chip.

According to an embodiment of the invention the circuit layout 708 can be varied to introduce a pre-determined bias towards either the first or the second state in the resulting circuit. In particular, the first invertor layout 722 may be considered as a first variant sub-circuit layout as discussed previously. Similarly, the second invertor layout 724 may be considered as a second variant sub-circuit layout.

Using the example of the 35 nm process above, in a first biasing example the length of the gate of the upper transistor layout 711 in the first invertor layout 722 may be reduced to 95 nm, and the length of the gate of the lower transistor layout 712 in the first invertor layout 722 may be increased to 105 nm. This gate length variation may be considered to be a circuit layout variation of the first variant sub-circuit layout, as set out above. The first invertor layout 722 may be applied to a silicon chip using a second lithographic process, as described previously, allowing the circuit layout variation to be accurately reproduced on the chip as a circuit variation 629. Similarly, the length of the gate of the lower transistor layout 714 in the second invertor layout 724 may be reduced to 95 nm, and the length of the gate of the upper transistor layout 713 in the second invertor layout 724 may be increased to 105 nm. This gate length variation may be considered to be part of a circuit layout variation of the second variant sub-circuit, layout as set out above. The second invertor layout 724 may be applied to a silicon chip using a second lithographic process, as described previously, allowing the circuit layout variation to be accurately reproduced on the chip as a circuit variation 629.

The resulting circuit on the silicon chip would be biased towards the first stable state. Indeed, the circuit variations described are such that the circuit would be expected to fall into the first stable state on power up.

It will also be appreciated that the biasing may be reversed with suitable modification to the circuit layout 708. In particular, in a second biasing example the length of the gate of the upper transistor layout 711 in the first invertor layout 722 may be increased to 105 nm, and the length of the gate of the lower transistor layout 712 in the first invertor layout 722 may be reduced to 95 nm. This gate length variation may be considered to be a circuit layout variation of the first variant sub-circuit layout, as set out above. The first invertor layout 722 may be applied to a silicon chip using a second lithographic process, as described previously, allowing the circuit layout variation to be accurately reproduced on the chip as a circuit variation 629. Similarly, the length of the gate of the lower transistor layout 714 in the second invertor layout 724 may be increased to 105 nm, and the length of the gate of the upper transistor layout 713 in the second invertor layout 724 may be reduced to 95 nm. This gate length variation may be considered to be part of a circuit layout variation of the second variant sub-circuit, layout as set out above. The second invertor layout 724 may be applied to a silicon chip using a second lithographic process, as described previously, allowing the circuit layout variation to be accurately reproduced on the chip as a circuit variation 629.

In this case the resulting circuit on the silicon chip would be biased towards the second stable state—falling into the second stable state on almost every power up.

The gate length variations described above, and hence the resulting bias in the silicon chip are controlled at production time using the second lithographic process, allowing arbitrary data to be embedded into the chip, using the methods and systems described previously. As the gate length variations in the resulting silicon chip are only 5 nm an attacker seeking to reverse engineer the chip, seeing it was formed using a 35 nm process, would not resolve such small differences. Thus, an attacker cloning such a chip would simply obtain a cloned chip without the data embedded in the original chip, using the above biases.

Figure 7B:
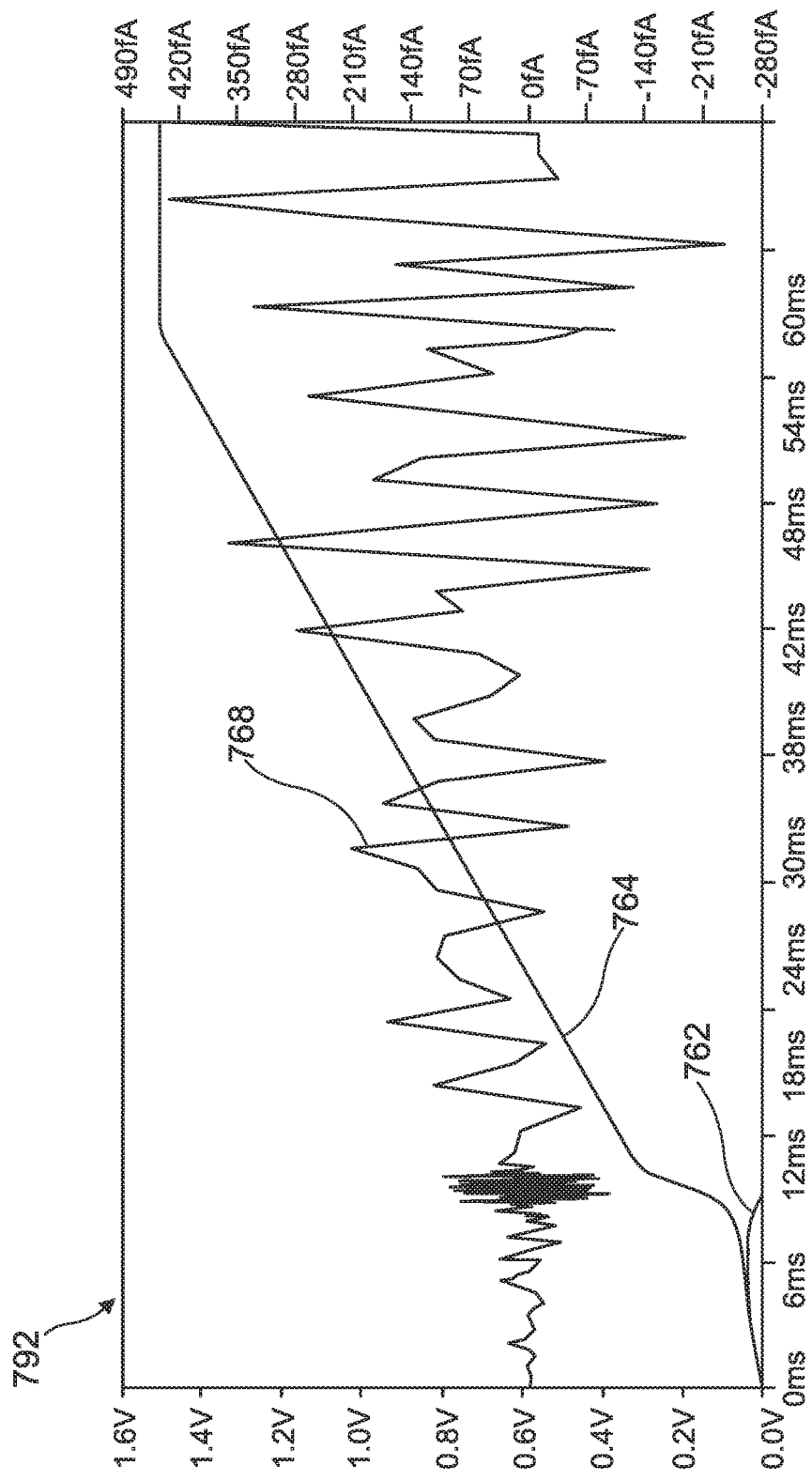
FIG. 7B shows the results of SPICE simulations of the operation of the circuit layouts described in reference to FIG. 7A.
Figure 7B:
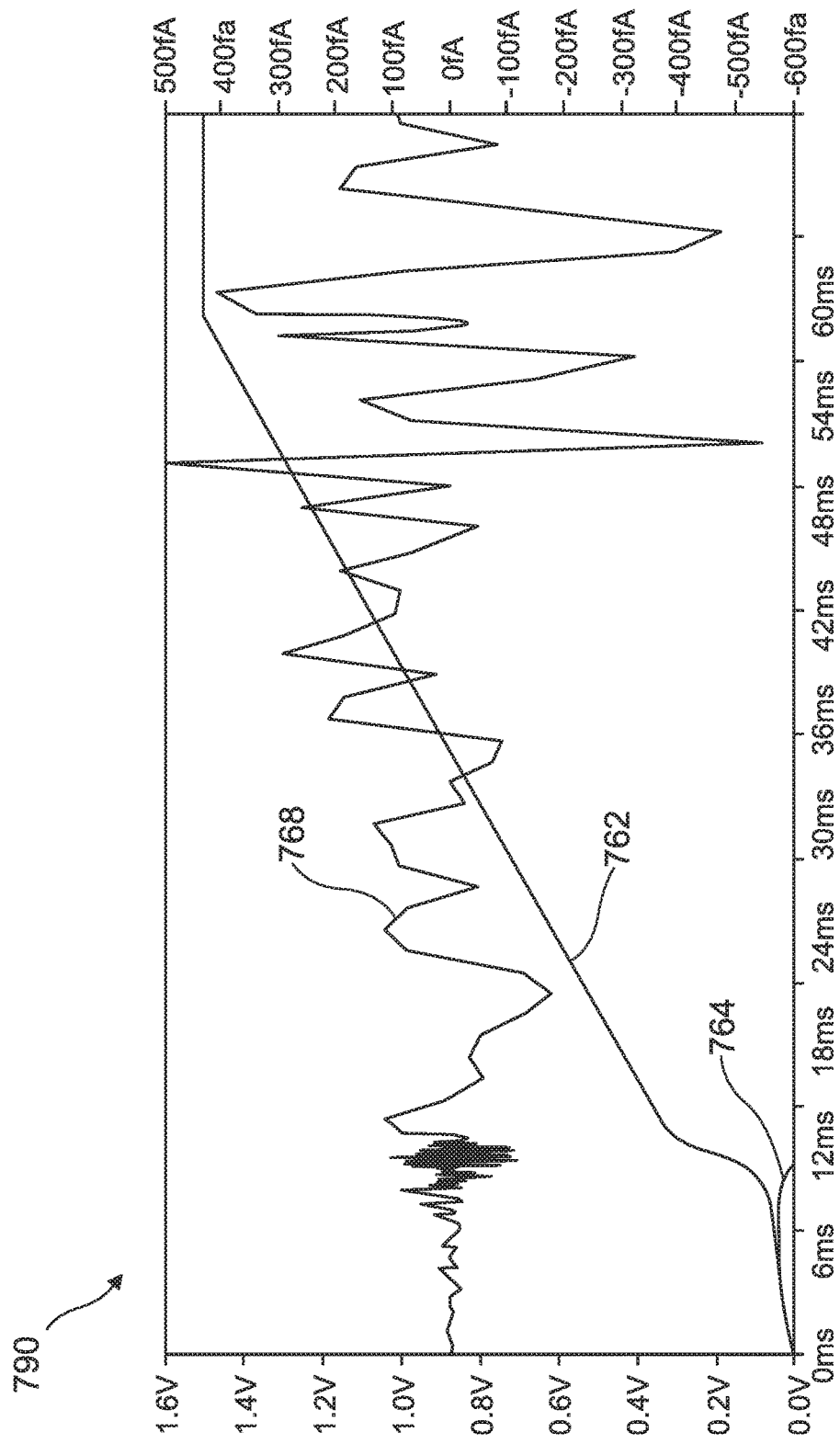
Figure 7B:
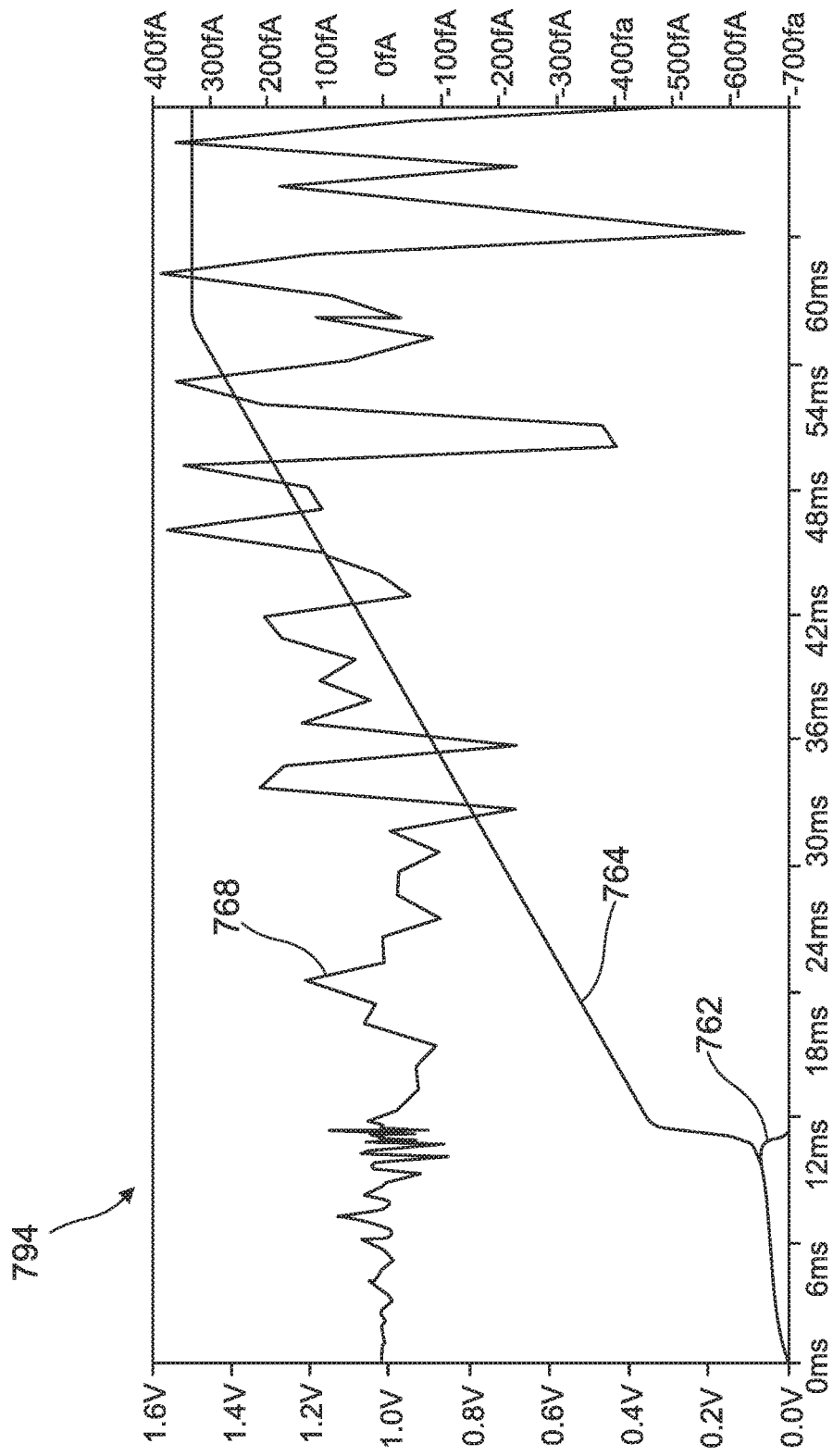

FIG. 7B shows the results of SPICE simulations of the operation of the circuit layouts described above in reference to FIG. 7A.

In particular, FIG. 7B shows three graphs 790; 792; 794. In each of the graphs 790; 792; 794 there is shown a plot 762 of the voltage across $V_{dd}$ and $V_1$; a plot 764 of the voltage across $V_{dd}$ and $V_2$; and a plot 768 of the current supplied by the current source 750. In each of the SPICE simulations corresponding to the graphs 790; 792; 794 the voltage, V, supplied by the voltage source 770 was increased monotonically from 0 to 1.5V in the first 50 ms. The current, I, supplied by the current source obeyed the relation i=VW (nt)/$10^{12}$, where W( ) is a white noise function, n is a scaling parameter and t is time.

The first graph 790 shows a SPICE simulation of the circuit layout 708 of the first biasing example, described above. As can be seen from around 9 ms onward the circuit layout 708 falls into the first state with the plot 762 of the voltage across $V_{dd}$ and $V_1$ rising to 1.5 V and the plot 764 of the voltage across $V_{dd}$ and $V_2$ falling to 0 V. Repeated SPICE simulations of the circuit layout 708 of the first biasing example repeatedly showed the circuit layout falling into the first state as expected, indicating a clear bias towards the first state introduced by the gate length variations.

Similarly, the second graph 792 shows a SPICE simulation of the circuit layout 708 of the second biasing example, described above. As can be seen from around 9 ms onward the circuit layout 708 falls into the second state with the plot 762 of the voltage across $V_{dd}$ and $V_1$ falling to 0 V and the plot 764 of the voltage across $V_{dd}$ and $V_2$ rising to 1.5 V. Repeated SPICE simulations of the circuit layout 708 of the second biasing example repeatedly showed the circuit layout falling into the second state as expected, indicating a clear bias towards the second state introduced by the gate length variations.

Finally, the third graph 794 shows a SPICE simulation of the unbiased circuit layout 708, described above, where each of the transistor gates were 100 nm long. As can be seen from around 9 ms onward the circuit layout 708 falls into the second state with the plot 762 of the voltage across $V_{dd}$ and $V_1$ rising to 1.5 V and the plot 764 of the voltage across $V_{dd}$ and $V_2$ falling to 0 V. Repeated SPICE simulations of this circuit layout 708 showed the circuit layout falling into the first or the second state with equal probability. This lack of bias is as expected given the equal gate lengths and the random unbiased thermal like noise introduced by the current source 750.

In the examples described above the circuit layouts of both of the invertors were modified in a complimentary fashion to produce a bias in the SRAM circuit layout. It will be appreciated however that for some circuit layouts such complementary modification may not be required and that a single circuit layout variation would be sufficient to produce a suitable bias.

Further Comments

The preceding description refers to silicon and silicon chips. However, the skilled person would appreciate that the methods and chips disclosed need not be based on silicon and any suitable semiconductor may be used. Example semiconductors include but are in no way limited to gallium arsenide and/or related compounds such as indium gallium arsenide.

The above description refers to beam steered lithography, typically referring to a lithographic technique where custom shapes can be drawn on a resist without the use of a mask. Examples of this technique include e-beam lithography but it will be appreciated that the skilled person would be aware of numerous such suitable technologies and the inventions outlined above are not limited to e-beam lithography.

The above description refers to mask based lithography, typically referring to a lithographic technique where a mask is used in exposing a resist. Examples of this technique include optical UV lithography but it will be appreciated that the skilled person would be aware of numerous such suitable technologies (including the use of non-optical illumination such as X-ray lithography) and the inventions outlined above are not limited to optical UV lithography.

It will be appreciated that the embodiments of the invention described above, have been described with reference to particular examples, using particular numbers of states, layer, circuits, and so on. The skilled person will appreciate that these are merely exemplary and the invention is not limited to such particular numbers of states, layer, circuits, and so on.

It will be appreciated that the methods described have been shown as individual steps carried out in a specific order. However, the skilled person will appreciate that these steps may be combined or carried out in a different order whilst still achieving the desired result.

It will be appreciated that the security of the any of the circuits in the preceding description (such as circuits implementing cryptographic operations or functionality) may also be increased through the use of obfuscation techniques, such as whitebox protection techniques. These could typically be applied in the early stages of circuit design, such as in a VHDL representation. Such obfuscation is known, for example, from WO 2012/150398 which is herein incorporated by reference in its entirety.

It will be appreciated that the boundaries between individual logic blocks, circuits and the like are merely illustrative and that alternative embodiments may merge logic blocks or circuits or elements, or may impose an alternate decomposition of functionality upon various logic blocks or circuits or elements.

The invention claimed is:

1. A method of individualizing a semiconductor chip of a batch of semiconductor chips with respective individualization data of the semiconductor chip, the method comprising:
   applying a plurality of circuit layouts to the semiconductor chip to form a plurality of circuits on the semiconductor chip,
   wherein for each circuit layout:
      said circuit layout is arranged such that:
         (a) the corresponding circuit, when triggered, falls into any one of two or more respective triggered states, and
         (b) one of the two or more respective triggered states is a respective preferred state defined by said circuit layout,
   wherein the plurality of respective preferred states of the circuits in the plurality of circuits encode the individualization data, and wherein each individualized semiconductor chip of the batch of semiconductor chips comprises a generic circuit; and
   wherein for one or more circuit layouts each circuit layout comprises two or more respective variant sub-circuit layouts, each respective sub-circuit layout corresponding to a respective triggered state of the circuit corresponding to the circuit layout.

2. The method of claim 1, wherein the plurality of respective preferred states of the circuits in the plurality of circuits encode the individualization data using an error correcting code.

3. The method of claim 1, wherein for each of the one or more circuit layouts:
   one of the respective variant sub-circuit layouts comprises a circuit layout variation with respect to the other ones respective variant sub-circuit layouts, wherein the circuit layout variation comprises any of, a dimension of a functional element, a position shift of a functional element, and a characteristic of a functional element.

4. The method of claim 3, wherein the functional element comprises any of:
   a gate;
   a source;
   a drain;
   a well;
   a resistor;
   a capacitor; and
   a connection.

5. The method of claim 4, wherein the generic circuit was formed on the semiconductor chip using a coarser resolution, wherein the a circuit layout variation defines a difference of the variant sub-circuit formed by applying the one of the respective variant sub-circuit with respect to the variant sub-circuits formed by applying the other ones respective variant sub-circuit layouts that cannot be resolved at the coarser resolution.

6. The method of claim 1, wherein the at least one circuit layout is applied using a beam steered lithographic process with a finer resolution, and
   the generic circuit is formed on the semiconductor chip using a mask based lithographic process.

7. The method of claim 1, wherein the individualization data comprises one or more cryptographic keys.

8. The method of claim 1, wherein the individualization data comprises one or more enablement vectors specifying the functionality of the generic circuit available to the individualized semiconductor chip.

9. The method of claim 1, wherein any of the circuit layouts comprise a respective obfuscated circuit layout.

10. A batch of individualized semiconductor chips, each individualized semiconductor chip comprising:
    a generic circuit; and
    a respective individualized plurality of circuits,
       wherein for each circuit of the respective plurality:
          said circuit corresponds to a respective circuit layout which is arranged such that:
             (a) the corresponding circuit, when triggered, falls into any one of two or more respective triggered states, and
             (b) one of the two or more respective triggered states is a respective preferred state defined by said circuit layout,
    wherein the respective individualized plurality of respective preferred states encode respective individualization data; and
    wherein for one or more circuit layouts each circuit layout comprises two or more respective variant sub-circuit layouts, each respective sub-circuit layout corresponding to a respective triggered state of the circuit corresponding to the circuit layout.

11. A method of securely embedding a circuit on a semiconductor wafer to form a reverse engineering resistant semiconductor chip, wherein the method uses a first lithographic process, and a second lithographic process, wherein the first lithographic process has a first characteristic resolution corresponding to a set of coarser resolutions and the second lithographic process has a second characteristic resolution corresponding to a set of finer resolutions, the method comprising:
   (a) for one or more layers of the semiconductor chip:
      applying a respective circuit layout from a first set of circuit layouts to said layer using a first lithographic process at a respective coarser resolution from the set of coarser resolutions, to form a respective circuit at said respective coarser resolution, (b) for one layer of the semiconductor chip:
applying a circuit layout to said layer using a second lithographic process at a respective finer resolution from the set of finer resolutions, to form the securely embedded circuit at said respective finer resolution, and wherein said circuit layout defines a set of functional elements in said securely embedded circuit that cannot be resolved at the respective coarser resolution of the set of coarser resolutions.

12. The method of claim 11, wherein the circuit layout defines a set of functional elements in said securely embedded circuit that cannot be resolved at any of the coarser resolutions of the set of coarser resolutions.

13. The method of claim 11, wherein the one layer of step (b) is one of the one or more layers of step (a), such that the one layer of step (b) comprises both the respective circuit at said respective coarser resolution and the securely embedded circuit at said respective finer resolution.

14. The method of claim 11, wherein the one layer of the semiconductor chip comprises the base layer.

15. The method of claim 11, wherein the securely embedded circuit uses one or more connections of a circuit in a higher layer.

16. The method of claim 11, wherein the first lithographic process comprises a mask based lithographic process, and
the second lithographic process comprises a beam steered lithographic process.

* * * * *